United States Patent [19]
Ohshima

[11] Patent Number: 5,365,112
[45] Date of Patent: Nov. 15, 1994

[54] SEMICONDUCTOR INTEGRATED CIRCUIT DEVICE HAVING AN IMPROVED BONDING PAD STRUCTURE

[75] Inventor: Yoichi Ohshima, Yokohama, Japan

[73] Assignee: Kabushiki Kaisha Toshiba, Kawasaki, Japan

[21] Appl. No.: 959,644

[22] Filed: Oct. 13, 1992

[30] Foreign Application Priority Data

Oct. 14, 1991 [JP] Japan .................. 3-291873

[51] Int. Cl.⁵ .................. H01L 21/31; H01L 29/40
[52] U.S. Cl. .................. 257/784; 257/786
[58] Field of Search .............. 257/784, 786, 915, 763, 257/758, 759, 760, 773

[56] References Cited

U.S. PATENT DOCUMENTS

| | | | |
|---|---|---|---|
| 4,472,730 | 9/1984 | Ohta | 257/786 |
| 4,916,397 | 4/1990 | Masuda et al. | 257/784 |
| 4,933,305 | 6/1990 | Kikkawa | 257/784 |

FOREIGN PATENT DOCUMENTS

| | | | |
|---|---|---|---|
| 0031965 | 3/1978 | Japan | 257/763 |
| 0005561 | 1/1986 | Japan | 257/763 |
| 0161735 | 6/1989 | Japan | 257/763 |

Primary Examiner—Rolf Hille
Assistant Examiner—Alexander Oscar Williams
Attorney, Agent, or Firm—Banner, Birch, McKie & Beckett

[57] ABSTRACT

A contact plug formed in a contact hole formed in a boron-containing BPSG insulating film, and a pad bed formed under a bonding pad portion of a wiring are formed of a three-layered polysilicon film, thus reducing the number of fabrication steps. A protective film may be provided on the pad bed. This structure facilitates the formation of the pad bed and protects the pad bed that prevents film shearing at the bonding pad portion, thereby improving the adhesion to the insulating film.

23 Claims, 23 Drawing Sheets

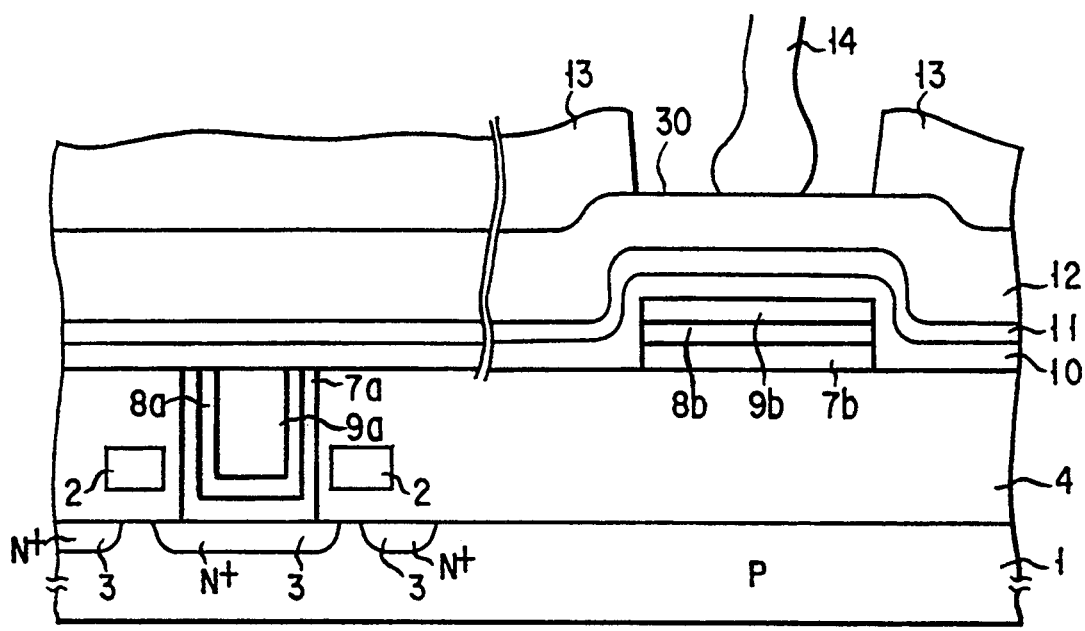
F I G. 4
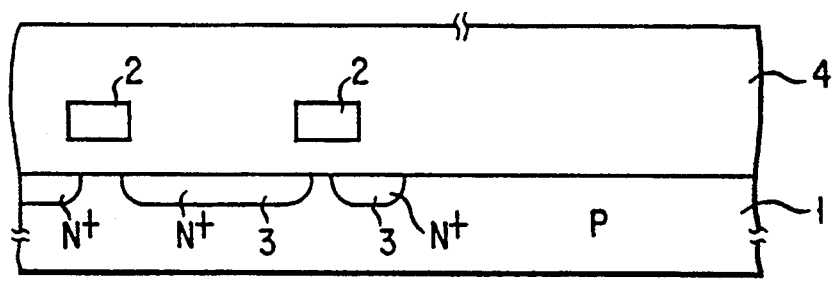
F I G. 5A
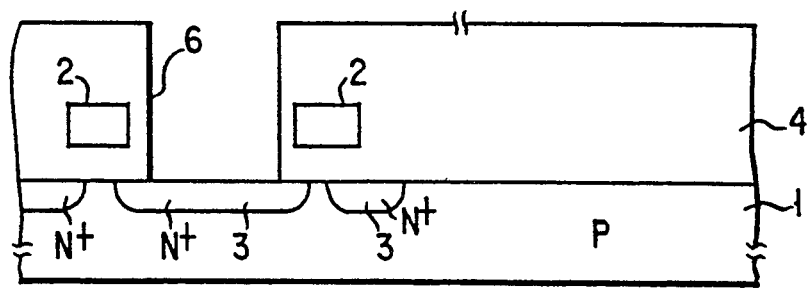
F I G. 5B

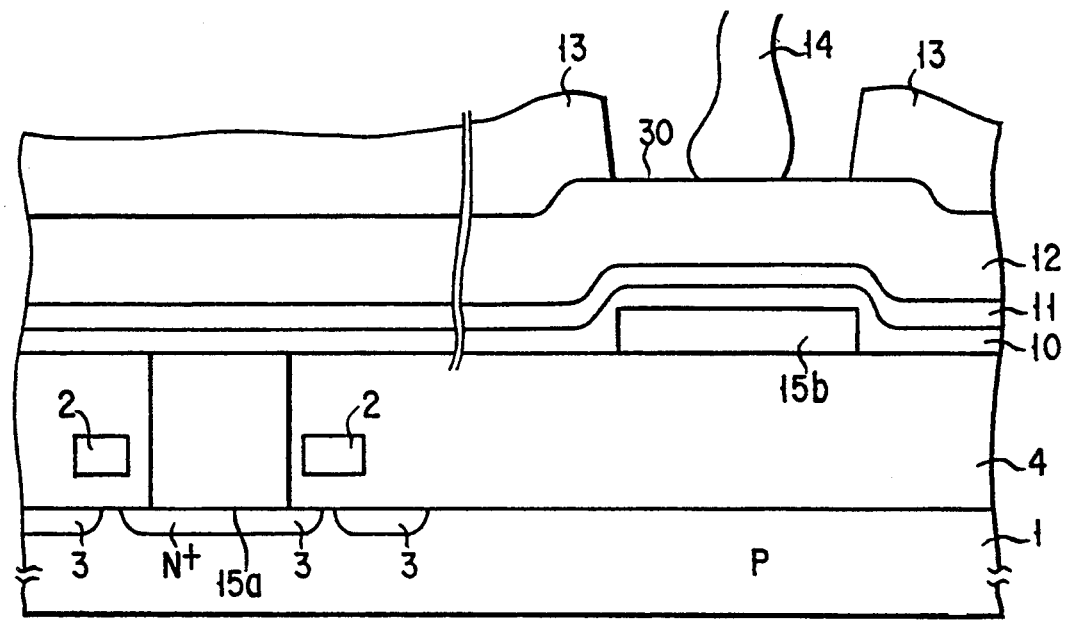
F I G. 7
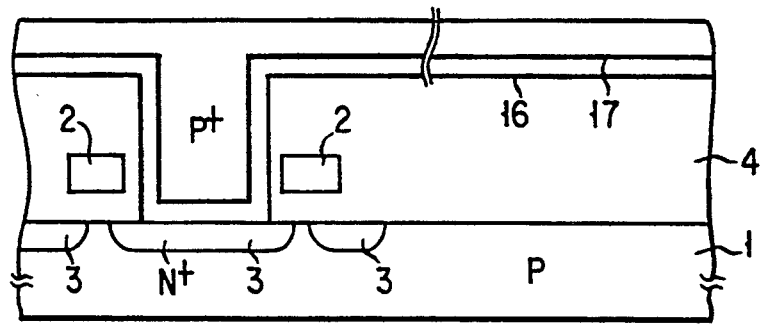
F I G. 8 A
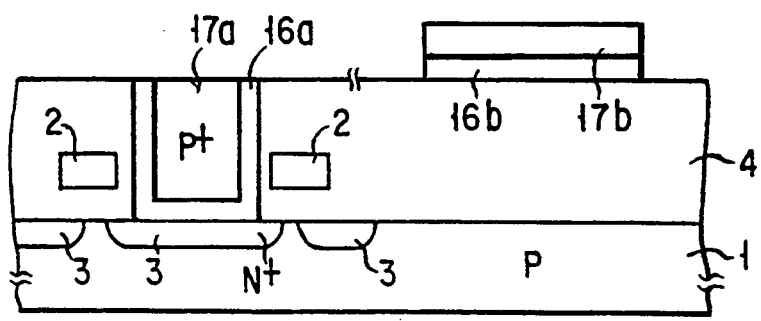
F I G. 8 B

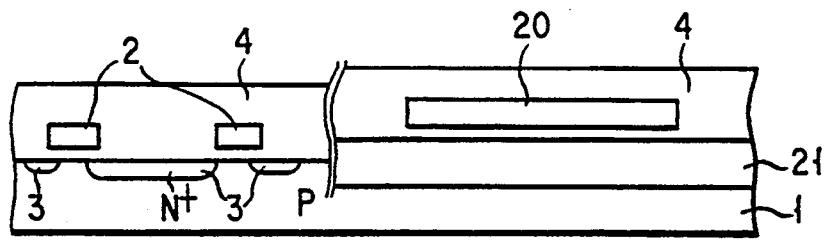
F I G. 13A
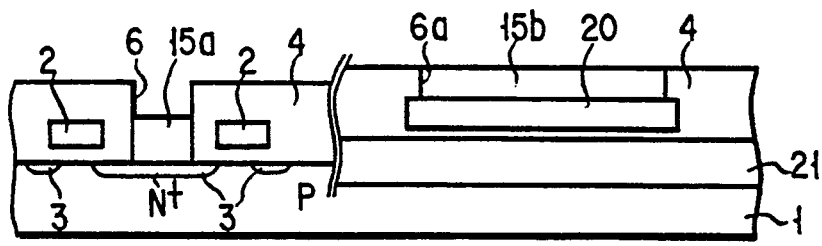
F I G. 13B
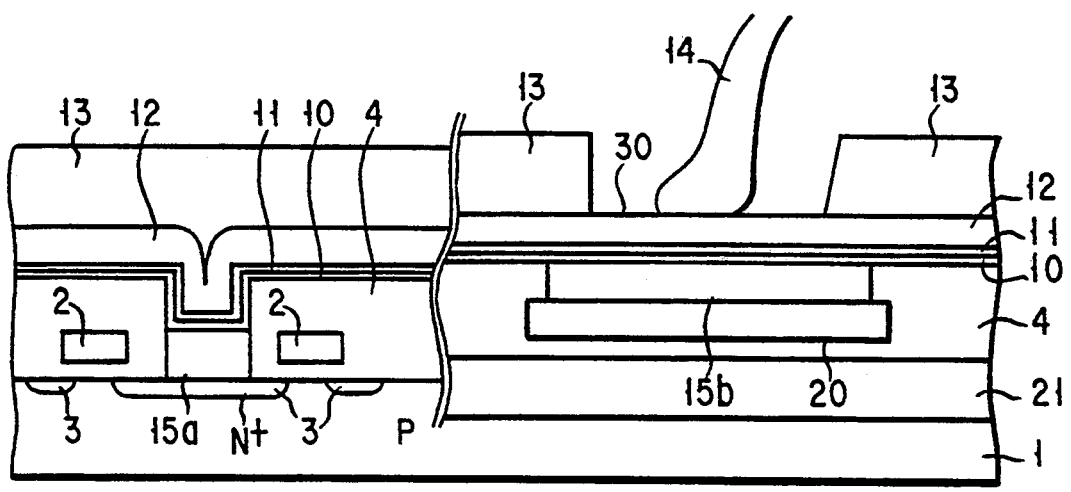
F I G. 14

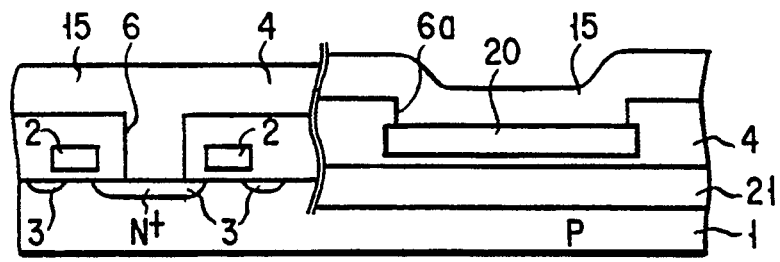
F I G. 15A
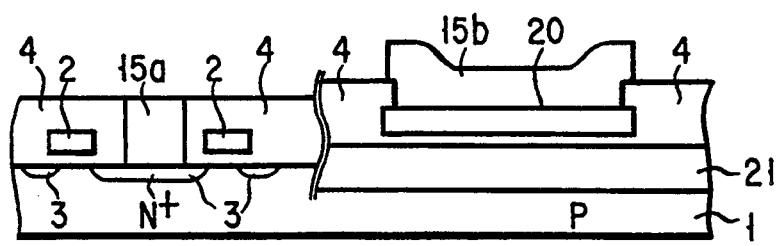
F I G. 15B
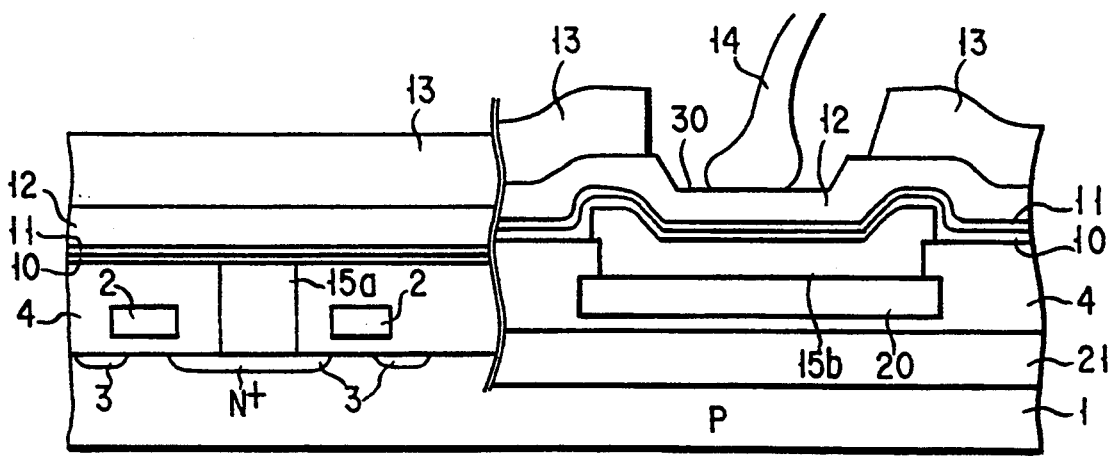
F I G. 16

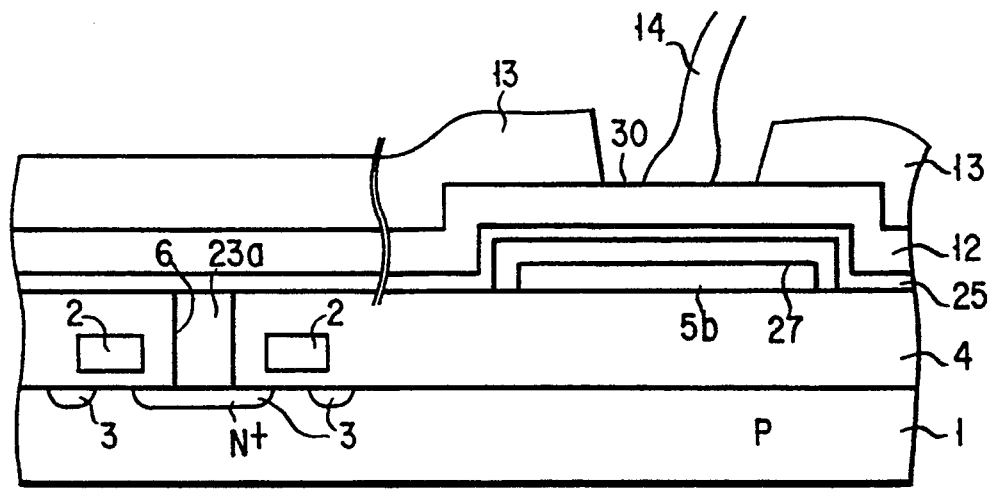
F I G. 26
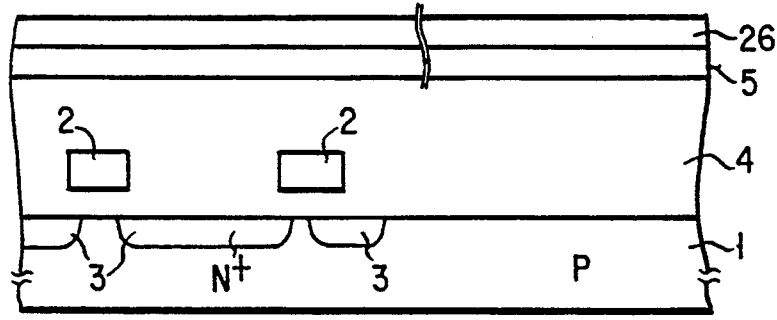
F I G. 27A
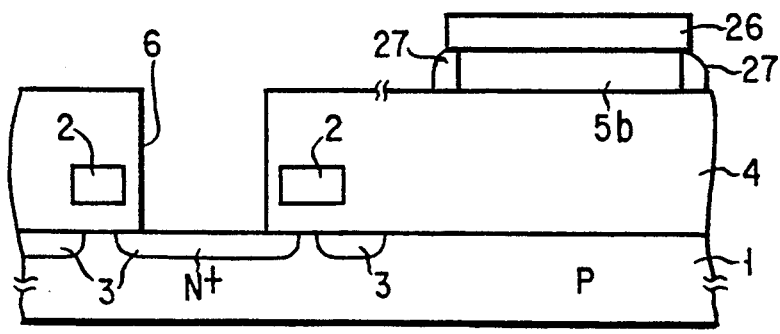
F I G. 27B

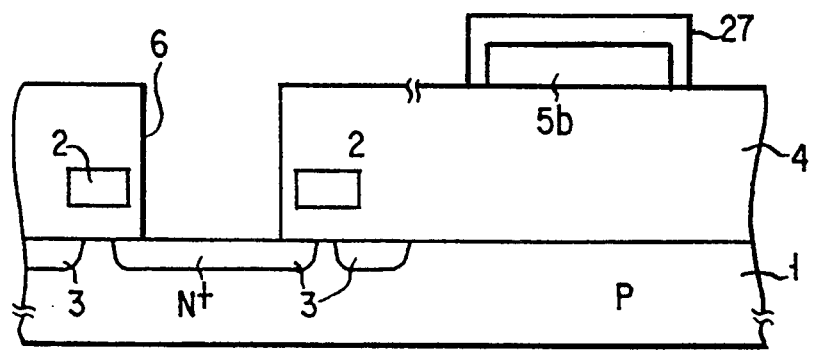
F I G. 33A
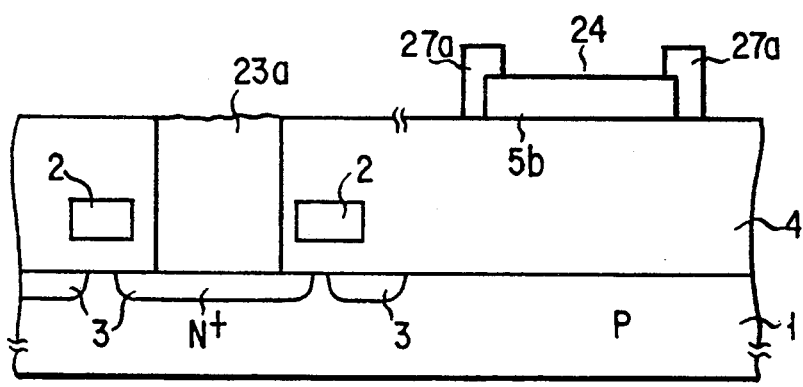
F I G. 33B
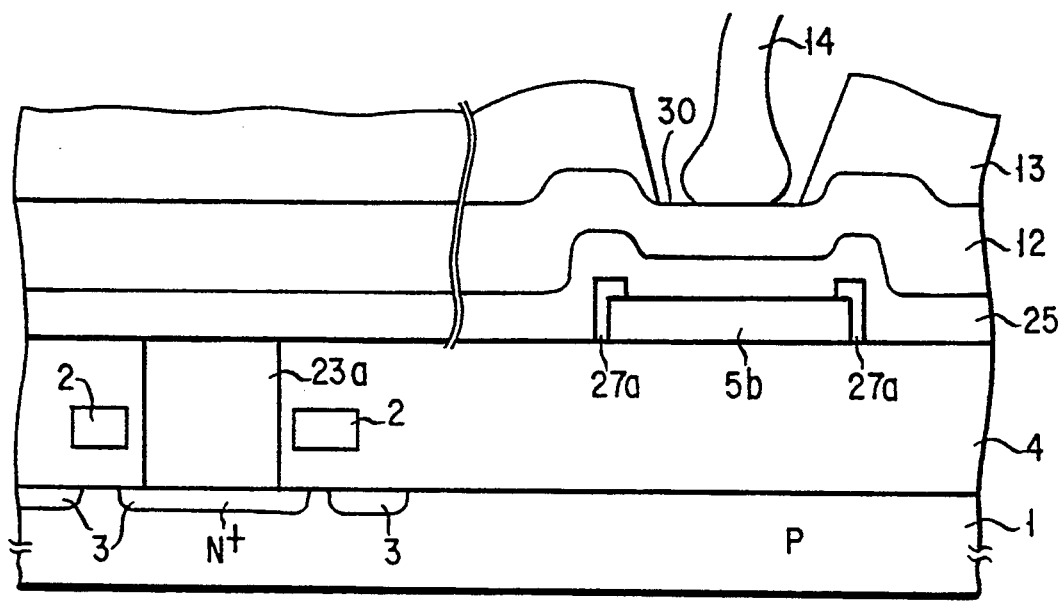
F I G. 34

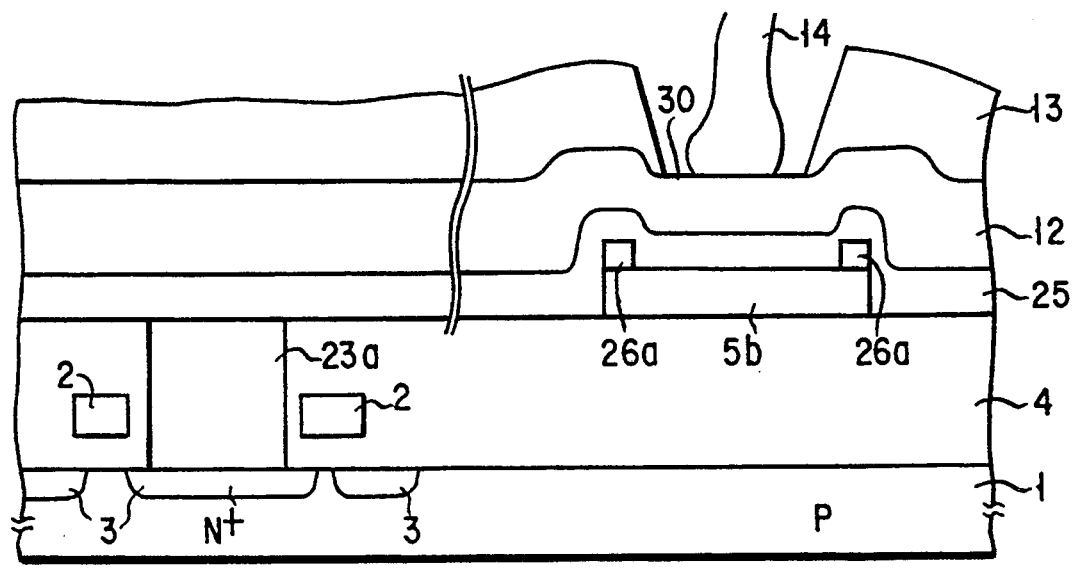
F I G. 37
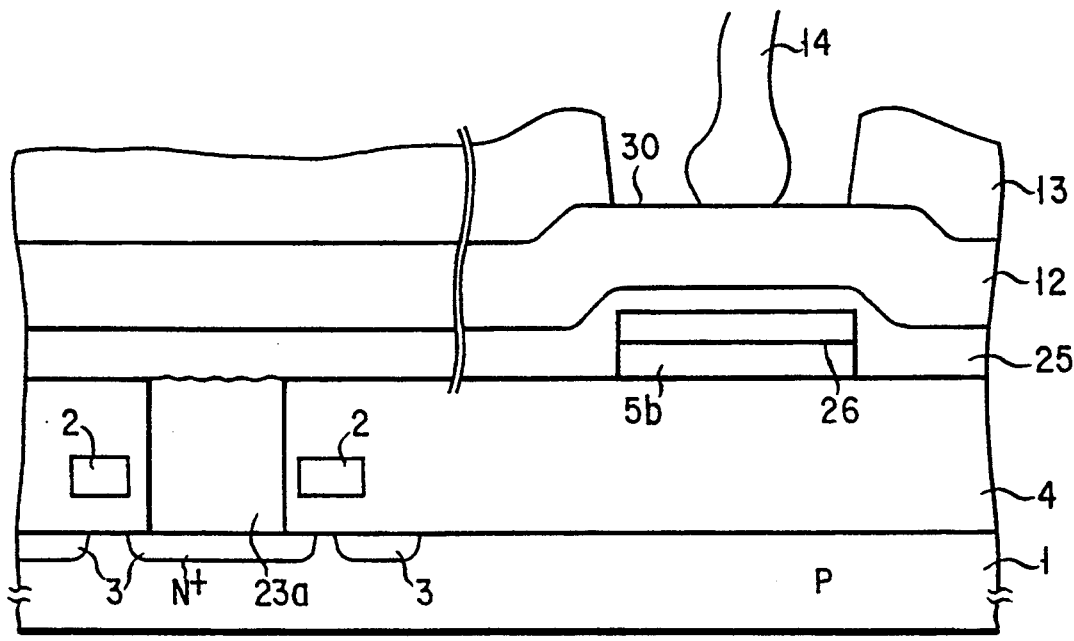
F I G. 38

SEMICONDUCTOR INTEGRATED CIRCUIT DEVICE HAVING AN IMPROVED BONDING PAD STRUCTURE

BACKGROUND OF THE INVENTION

1. Field of the Invention

The present invention relates to a semiconductor integrated circuit device and a method of fabricating the same and, more particularly, to a structure of a semiconductor substrate connected to an external lead-wire, and a method of fabricating that structure.

2. Description of the Related Art

In connecting a semiconductor integrated circuit (IC) device, such as IC or LSI circuit, to an external circuit, a bonding pad on a chip comprising a semiconductor substrate is connected to external lead wires on a package by Au or Al wires. FIG. 1A shows a conventional structure of a bonding pad portion (electrode leading portion) provided to electrically connect a lead wire of the package to an internal circuit of the chip. In FIG. 1A, an insulating film 4 made of BPSG or the like is formed on a semiconductor substrate 1 to cover the gate electrode, etc. Formed on the insulating film 4 is an Al wiring 12 consisting of Al, Si, Cu, etc., which is lead out from the internal circuit. This is where a lead wire 14 is connected, and thus serves as a bonding pad portion 30. The wiring 12 including this bonding portion is covered with a top passivation film 13. To improve the reliability of the Al wiring, a barrier metal structure having, for example, an Al—Si—Cu film 12, a TiN film 11 and Ti film 10 laminated has recently been used as a wiring material, as shown in FIG. 1B. Accordingly, boron in a BPSG film normally used as the insulating film 4 and the Ti film 10, the lowest portion of the laminated wiring, produce a reaction product TiBx. Since this product is chemically stable, the Ti film 10 is shorn from the BPSG film 4 when tensile stress is externally applied via the lead wire 14 to the bonding pad portion. As the boron concentration in the BPSG film gets higher (approximately $1 \times 10^{21} P/cm^3$ or above), this phenomenon becomes more prominent.

To prevent such film shearing, the use of the structure as shown in FIG. 2D has been proposed. That is, a pad bed layer 5 is provided between the BPSG insulating film 4 in the bonding pad region and the laminated wiring (Al—Si—Cu/TiN/Ti) to prevent the BPSG film 4 from directly contacting Ti in the laminated wiring. In view of the adhesion between the BPSG film 4 and Ti, the pad bed layer 5 is formed of a high melting-point metal which does not easily react with polycrystalline silicon (hereinafter simply referred to as "polysilicon") or boron, or its silicide or the like.

The fabrication processes of this prior art will be described referring to FIGS. 2A to 2D. As shown in FIG. 2A, a polysilicon gate 2 and a diffusion region 3 are provided in the left-half device region of the semiconductor substrate 1 to form a transistor or another device. The BPSG insulating film 4 is deposited as an insulating film on the surface of the resultant structure. Then polysilicon is deposited as the pad bed layer 5 on the entire surface of the resultant structure. As shown in FIG. 2B, a resist pattern (not shown) is formed using photolithography to leave the pad bed layer 5 of polysilicon in the region where a bonding pad is to be formed later. Then, part of the diffusion region 3 in the semiconductor substrate 1 is exposed to form a contact hole 6 in the BPSG insulating film 4, as shown in FIG. 2B. Subsequently, as shown in FIG. 2C, the Ti film 10, TiN film 11 and Al—Si—Cu film 12 are sequentially deposited by a sputtering method. After the laminated wiring consisting of the Ti film 10, TiN film 11 and Al—Si—Cu film 12 is processed according to a wiring pattern, a top passivation film 13 is deposited on the entire surface of the resultant structure. Then, the top passivation film 13 is etched according to a resist pattern to form a bonding pad portion, as shown in FIG. 2D. Then, the lead wire 14 is bonded on the wiring of a pad opening portion 30 to provide electric connection to an external circuit. As the BPSG film 4 cannot directly contact the Ti film 10 of the laminated wiring at the bonding pad portion in this example, film shearing can be prevented but with an increased process for depositing and processing the pad bed layer 5.

A multi-layered wiring structure becomes popular to cope with recent miniaturization of a semiconductor IC device such as LSI. In this structure, an upper wiring is deposited through an interlayer insulating film on the wiring on the semiconductor substrate. The upper and lower wirings are electrically connected by a low-resistance material buried in a contact hole formed in this interlayer insulating film. This involves an additional technology of burying a low-resistance material in the contact hole, increasing the fabrication processes.

FIGS. 3A and 3B illustrate cross sections in the processes of burying tungsten (W), for example, in the contact hole. The fabrication up to the formation of the contact hole 6 is the same as in FIG. 2B. FIG. 3A shows a cross section after selectively growing a tungsten (W) layer 23 after the formation of the contact hole 6. While the W layer 23 is selectively formed on the contact portion, it also selectively grows on the pad bed layer 5. The bonding pad formed in this manner cannot keep sufficient strength against the tensile stress that is externally applied via the lead wire. FIG. 3B shows a cross section after depositing the W layer 23 on the entire surface by a blanket method. In this case, since the pad bed layer 5 is formed of a polysilicon film, a layer of a high melting-point metal or its silicide, a sufficient selection ratio to W may not be secured so that the layer 5 may be also be etched at the time W is etched back. As a solution to this problem, the pad bed region may be masked with a resist pattern at the time W is etched back. This method yields a bonding pad having a laminated structure of pad bed material and contact-hole burying tungsten. But, this structure cannot keep sufficient strength against the tensile stress that is externally applied via the lead wire. It is also know to use polysilicon as the contact-hole burying material. The main flow of the process of burying polysilicon in the contact hole is to perform the etch-back step after depositing polysilicon on the entire surface of the resultant structure. This is substantially the same as the case where W is formed by the blanket method. As polysilicon has a high resistivity, it is doped with an impurity to serve as the contact-hole burying material. In the case where boron is used as an impurity, if the polysilicon film is left on the bonding pad portion, it produces TiBx together with Ti deposited on that polysilicon film, lowering the adhesion, as mentioned earlier. If the polysilicon film is to be removed at the time the etch-back step is carried out, a sufficient etching ratio to the pad bed material cannot be secured, as discussed earlier.

In short, as the miniaturization of semiconductor IC devices progresses, a step of burying a low-resistance material (contact plug) for connection between wirings or a wiring and the device region should be performed in addition to a step of forming the pad bed, thus increasing the number of steps. If a new material is selected for the pad bed, when it adapts poorly to the underlying insulating film containing boron such as BPSG, this pad bed will be shorn from the insulating film by the tensile stress applied via the lead wire. Further, in the case where a plug is formed in the contact hole, when an extra plug forming material formed on the semiconductor substrate is etched out, the necessary pad bed is etched out at the same time, as described above.

SUMMARY OF THE INVENTION

It is therefore an object of the present invention to provide a semiconductor IC device with such a structure that can improve the adhesion to the insulating film to widen the selection of pad bed materials by reducing the number of steps by forming a pad bed for prevention of film shearing at a bonding pad portion in the same steps as done for the other portion and by protecting the pad bed, and a method of fabricating the same.

The present invention is characterized in that a pad bed provided to prevent reaction between a wiring on a bonding pad portion of a semiconductor IC device and an underlying insulating film and a low-resistance material buried in a contact hole formed in the insulating film to provide electrical connection between wirings or between a wiring and an active region in a semiconductor substrate, i.e., a contact plug, are made of the same material and formed in the same step or a coating film is formed on the pad bed.

According to a first aspect of the present invention, there is provided a semiconductor integrated circuit device comprising: a semiconductor substrate; an insulating film formed on the semiconductor substrate; a pad bed layer formed on the insulating film or in a groove formed in the insulating film; a contact hole formed in the insulating film; a contact plug buried in the contact hole, at least a portion of the contact plug being made of the same material as the pad bed layer; and a wiring formed on the insulating film and having a bonding pad portion arranged on the pad bed layer, the wiring contacting the contact plug.

According to a second aspect of the present invention, there is provided a semiconductor integrated circuit device comprising: a semiconductor substrate; an insulating film formed on the semiconductor substrate; a pad bed layer formed on the insulating film or in a groove formed in the insulating film; a coating film for covering the pad bed layer; a contact hole formed in the insulating film; a contact plug buried in the contact hole, at least a portion of the contact plug being made of the same material as the pad bed layer; and a wiring formed on the insulating film and having a bonding pad portion arranged on the pad bed layer, the wiring contacting the contact plug.

According to a third aspect, there is provided a method of fabricating a semiconductor integrated circuit device, comprising the steps of: forming an insulating film on a semiconductor substrate; forming a contact hole in the insulating film; forming a conductive film on an entire surface of the insulating film; etching the conductive film to simultaneously form a pad bed layer on the insulating film and a contact plug in the contact hole; and forming a wiring on the insulating film, the wiring having a bonding pad portion lying on the pad bed layer and contacting the contact plug.

According to a fourth aspect, there is provided a method of fabricating a semiconductor integrated circuit device, comprising the steps of: forming an insulating film on a semiconductor substrate; forming a pad bed layer on the insulating film or in a groove formed in the insulating film; forming a coating film for covering the pad bed layer; forming a contact hole in the insulating film; burying a contact plug in the contact hole; and forming a wiring on the insulating film, the wiring having a bonding pad portion lying on the pad bed layer and contacting the contact plug.

According to a fifth aspect, there is provided a method of fabricating a semiconductor integrated circuit device, comprising the steps of: forming a conductive film on a semiconductor substrate; etching the conductive film to form a gate electrode arranged in a device region of the semiconductor substrate and a buffer layer; forming an insulating film on the semiconductor substrate to bury the gate electrode and the buffer layer in the insulating film; forming a pad bed layer on the insulating film, in a groove formed in the insulating film or in a through hole formed in the insulating film so as to directly contact the buffer layer in the through hole; forming a contact hole in the insulating film; burying a contact plug in the contact hole; and forming a wiring on the insulating film, the wiring having a bonding pad portion lying on the pad bed layer and contacting the contact plug.

The pad bed and the contact plug can be formed in the same process of etching the conductive layer. Further, a coating film may be formed on the pad bed to prevent the contact plug from contacting the pad bed as well as enhance the adhesion of the pad bed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a cross section of a semiconductor IC device according to a first embodiment of the present invention;

FIGS. 5A to 5D are cross sections for explaining the process of fabricating the conventional semiconductor IC device according to the first embodiment;

FIG. 7 is a cross section of the semiconductor IC device according to the second embodiment;

FIGS. 8A and 8B are cross sections for explaining the process of fabricating a conventional semiconductor IC device according to a third embodiment of the present invention;

FIGS. 13A and 13B are cross sections for explaining the process of fabricating a conventional semiconductor IC device according to a sixth embodiment of the present invention;

FIG. 14 is a cross section of the semiconductor IC device according to the sixth embodiment;

FIGS. 15A and 15B are cross sections for explaining the process of fabricating a conventional semiconductor IC device according to a seventh embodiment of the present invention;

FIG. 16 cross section of the semiconductor IC device according to the seventh embodiment;

FIG. 26 is a cross section of the semiconductor IC device according to a thirteenth embodiment of the present invention;

FIGS. 27A to 27D are cross sections for explaining the process fabricating a conventional semiconductor IC device according to a fourteenth embodiment of the present invention;

FIGS. 33A and 33B are cross sections for explaining the process of fabricating a semiconductor IC device according to an 18th embodiment of the invention;

FIG. 34 is a cross section of a semiconductor IC device according to an 18th embodiment of the invention;

FIG. 37 is a cross section of a semiconductor IC device according to the 20th embodiment of the invention;

FIG. 38 is a cross section of a semiconductor IC device according to a 21st embodiment of the invention;

DETAILED DESCRIPTION OF THE PREFERRED EMBODIMENTS

Figure 1A:
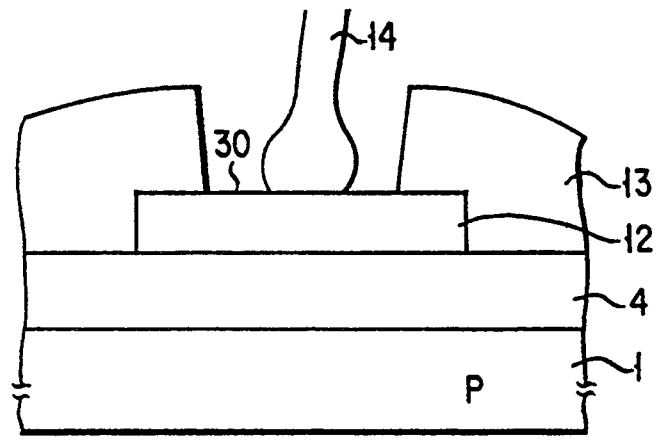
FIGS. 1A and 1B are cross sections of conventional semiconductor IC devices.
Figure 1B:
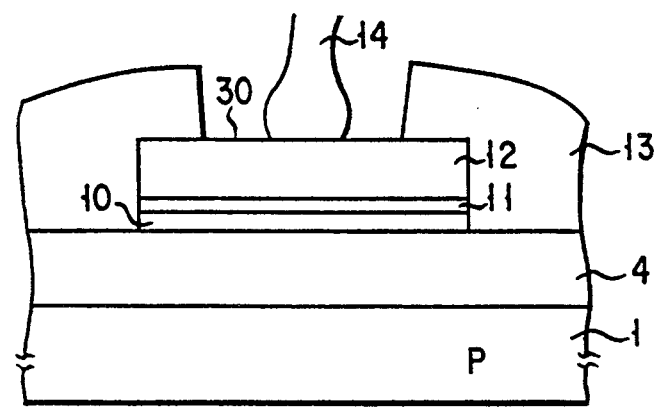
Figure 2A:
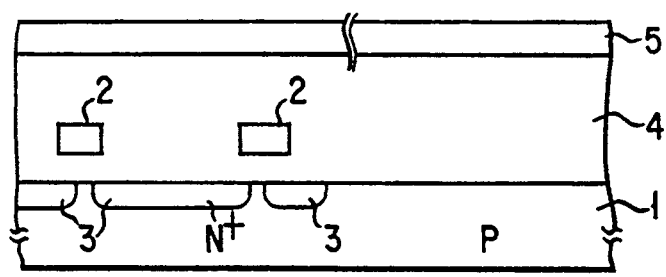
FIGS. 2A to 2D are cross sections for explaining the process of fabricating a conventional semiconductor IC device.
Figure 2B:
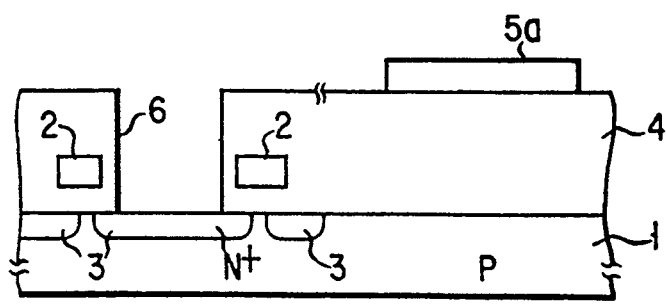
Figure 2C:
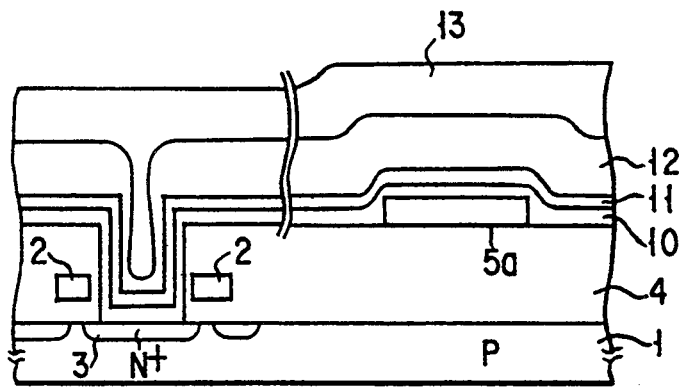
Figure 2D:
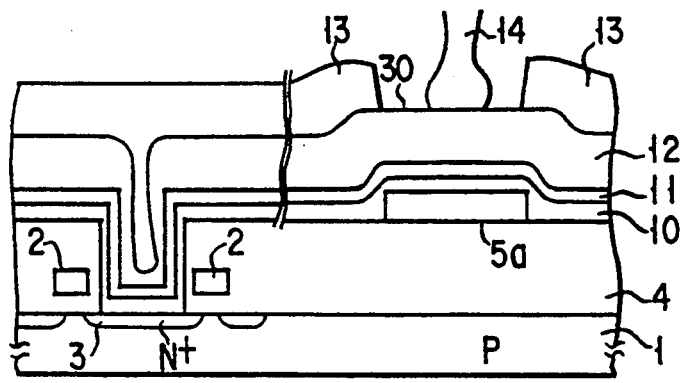
Figure 3A:
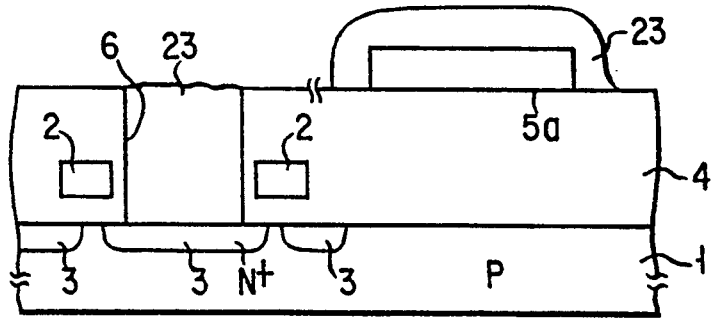
FIGS. 3A and 3B are cross sections for explaining the fabricating processes for a conventional semiconductor IC device.
Figure 3B:
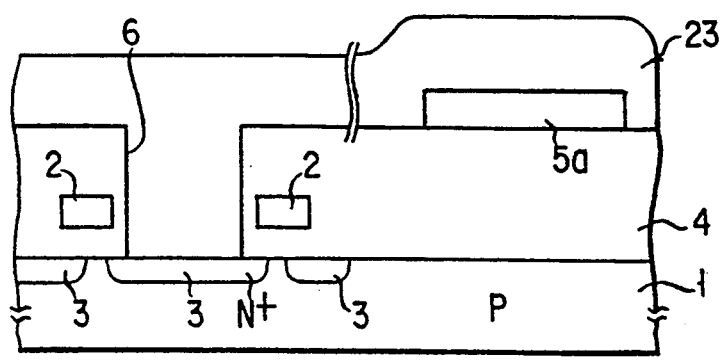

Semiconductor IC devices and methods of fabricating the same according to preferred embodiments of the present invention will now be described referring to the accompanying drawings.

FIG. 4 shows the cross section of a semiconductor IC device according to the first embodiment of the present invention. As shown in FIG. 4, the left half of a P type silicon substrate 1 shows a semiconductor circuit region (device region) which has, for example, a CMOS structure, and where a gate electrode 2 and an N+-diffusion layer region 3, included in a transistor or a diode, are formed. On the right half of the substrate 1, a wiring is formed mainly. In this area is formed a bonding pad portion 30 which electrically connects a lead wire 14 to an internal semiconductor circuit. Deposited on the semiconductor substrate 1 is an insulating film 4 containing boron, such as BPSG, which covers the gate electrode 2, etc. The wiring on the insulating film 4 has a laminated structure consisting of a Ti film 10, a TiN film 11 and an Al—Si—Cu film 12 to improve the reliability. When the Ti film 10 reacts with the BPSG film 4, forming TiBx as mentioned earlier, film shearing occurs. To prevent this problem, a pad bed is formed. The pad bed has a three-layer structure consisting of polysilicon layers 7b, 8b and 9b, the same structure as a plug buried in a contact hole formed in the insulating film 4. The plug electrically connects to the wiring on the insulating film 4. The uppermost Al alloy layer 12 is covered with a top passivation film 13, and the lead wire 14 is connected to this Al alloy layer 12 via a contact hole formed in the film 13.

Figure 5C:
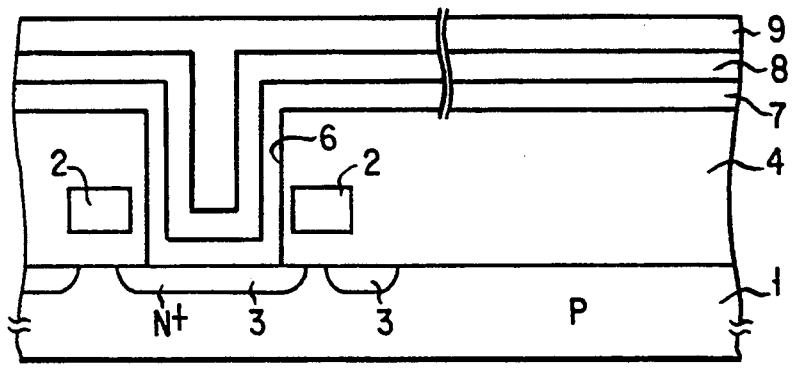
Figure 5D:
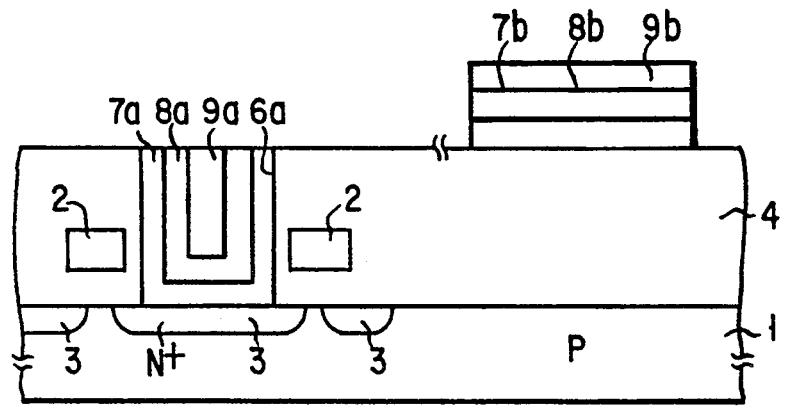

The fabrication processes for this semiconductor IC device will be described referring to FIGS. 5A to 5D. Although a CMOS structure is normally formed in the device region, only an NMOS region is shown in FIGS. 5A to 5D. First, as shown in FIG. 5A, the gate electrode 2 and N+-diffusion layer region 3 for forming a transistor or a diode are formed at predetermined positions on the P+-silicon substrate 1, and the BPSG insulating film 4 is then deposited on the resultant structure. In FIGS. 5A to 5D, the left half portion shows a semiconductor circuit region (device region) and the right half shows the bonding pad portion 30 which electrically connects the lead wire to an internal circuit in the semiconductor chip. Then, a portion where a contact hole is to be formed is patterned using a resist pattern, and the BPSG film 4 is selectively etched out using an anisotropic ion etching, such as RIE, forming a contact hole 6, as shown in FIG. 5B. Subsequently, for example, polysilicon 7 is deposited about 500 angstroms ("Å" will be used hereinafter) thick, as shown in FIG. 5C. Then, for example, arsenic (As) is ion-injected in the NMOS region and $BF_2$ is ion-injected into the PMOS region (not shown; the same is true of the other diagrams) separately using the respective resists (not shown). At this time, the region where the bonding pad is to be formed (right half in the diagram) is treated as the NMOS region and As is ion-injected, or no impurity is ion-injected. Then, polysilicon 8 is deposited about 2000 Å thick, followed by separate ion-injection of, for example, P in the NMOS region and B in the PMOS region with the respective resists. At this time, phosphorus is ion-injected in the bonding-pad forming region or nothing is ion-injected there. Subsequently, polysilicon 9 is deposited about 6000 Å thick to completely fill the contact hole 6. Then, after the bonding pad portion 30 is masked with a resist pattern, the polysilicon layers 9, 8 and 7 are sequentially etched to form a polysilicon plug in the contact hole 6. This plug connects the N+-diffusion layer region 3 to the laminated wiring. At the same time, a pad bed layer consisting of polysilicons 7, 8 and 9 is formed on the bonding pad portion 30. Then, the previously ion-injected impurity is diffused uniformly by, for example, nitrogen annealing to reduce the sheet resistance of the contact plug. Subsequently, the Ti film 10, TiN film 11 and Al—Si—Cu film 12 are deposited sequentially from the bottom by sputtering as has been described referring to FIG. 4. After the laminated wiring (Al—Si—Cu/TiN/Ti) is processed according to a wiring pattern, the top passivation film 13 is deposited on the entire surface of the resultant structure. Then, the top passivation film 13 is etched according to a resist pattern to form the bonding pad portion 30. Then, the lead wire 14 is bonded on the wiring on the pad exposed portion to provide electric connection to an external circuit.

According to this embodiment, the Ti film 10 of the laminated wiring on the bonding pad portion 30 is in close contact to the polysilicon layer 9 that does not contain boron. When external tensile stress is applied via the lead wire 14, therefore, shearing which otherwise probably occurs at the boundary between the Ti film 10 and the BPSG film 4 can be prevented. The foregoing description of this embodiment has mentioned TiN and Ti as barrier metal materials of the laminated wiring. When other materials, such as TiW or TiN, which reacts with boron to yield a stable product like $TiB_x$ that has a lower adhesive strength, is used, the same effect is obtained. Semiconductor IC devices using those materials as barrier metal or wiring are therefore within the scope of the present invention. This effect is obtainable also in the second and other embodiments, which will be discussed shortly. Such an advantage of suppressing bonding shearing becomes clearer when an ultrasonic (US) bonding method involving large tensile stress is used. This is true of the second and other embodiments. Since the pad bed layer for preventing the film shearing is formed of polysilicon, the same material as that of the plug, the plug and the pad bed can be formed at the same time, making it possible to effectively reduce the number of steps. According to this embodiment, three polysilicon films are separately deposited and two ion injections are carried out for each of the N- and P-type impurities during this period as a method of forming the contact plug. This scheme is to make the impurity concentration in the plug uniform and suppress the resistance of the plug lower. As long as the resistance of the plug is sufficiently low, therefore, the formation of the plug need not involve several steps. While polysilicon is used as the material for the plug buried in the contact hole in this embodiment, metals, such as W, Mo, Al and Cu or their silicides or nitrides may also be used in this invention. As the top passivation film, an insulating film such as a PSG film, CVD $SiO_2$ film or LPD $SiO_2$ film may also be used. Although ion injection has been explained as means of introducing an impurity in the contact plug in this embodiment, the present invention is not limited to this particular method, but may employ other means.

Figure 6A:
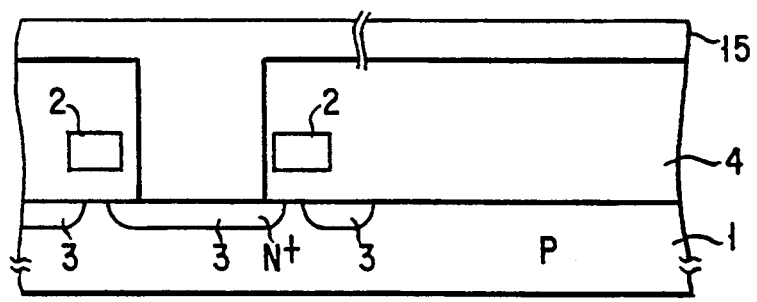
FIGS. 6A and 6B are cross sections for explaining the process of fabricating a conventional semiconductor IC device according to a second embodiment of the present invention.
Figure 6B:
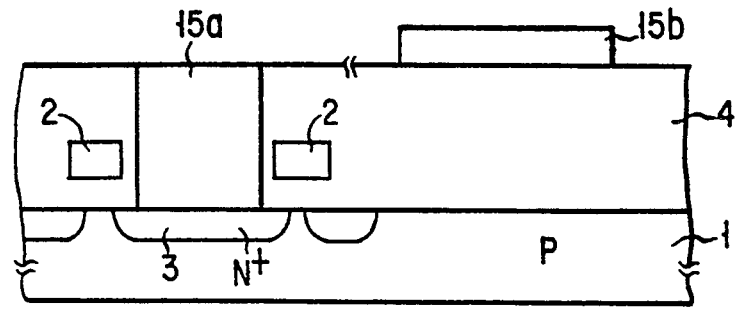

A second embodiment will be described referring to FIGS. 6A, 6B and 7. The processes of providing the diffusion region and gate electrode 2 in a predetermined region on the P silicon substrate 1 to form a device region, forming the insulating film 4 containing boron such as BPSG, and forming the contact hole 6 in the insulating film 4 are the same as those of the first embodiment as shown in FIGS. 5A and 5B. As shown in FIG. 6A, a W layer 15 is deposited on the entire surface of this substrate 1 by chemical vapor deposition (CVD). Then, with the bonding pad region masked with a resist pattern, the W layer is etched back, as shown in FIG. 6B. Consequently, a W contact plug 15a is formed in the contact hole, while a pad bed layer 15b consisting of W is formed on the pad. As in the first embodiment, the Ti film 10, TiN film 11 and Al—Si—Cu film 12 are deposited sequentially from the bottom by sputtering and specific portions are etched to form a laminated wiring as shown in FIG. 7. Further, the top passivation film 13 is deposited on the entire surface of the resultant structure, and the top passivation film 13 is etched out to form the bonding pad portion. Then, the lead wire 14 is bonded on the exposed bonding pad portion 30 where a W pad bed layer 15 is formed. The second embodiment also forms the pad bed layer of W that is a material to fill the contact hole. This makes it possible to avoid an increase in the number of steps which may otherwise be caused by forming a pad bed layer of a separate material, thus preventing film shearing at the bonding pad portion 30. Although CVD is used to deposit W, another method, such as sputtering may also be used to acquire the same advantage in order to achieve the purpose of the present invention. The same advantage can be attained by using other metals than W, such as Mo, Al and Cu, or their silicides.

Figure 9:
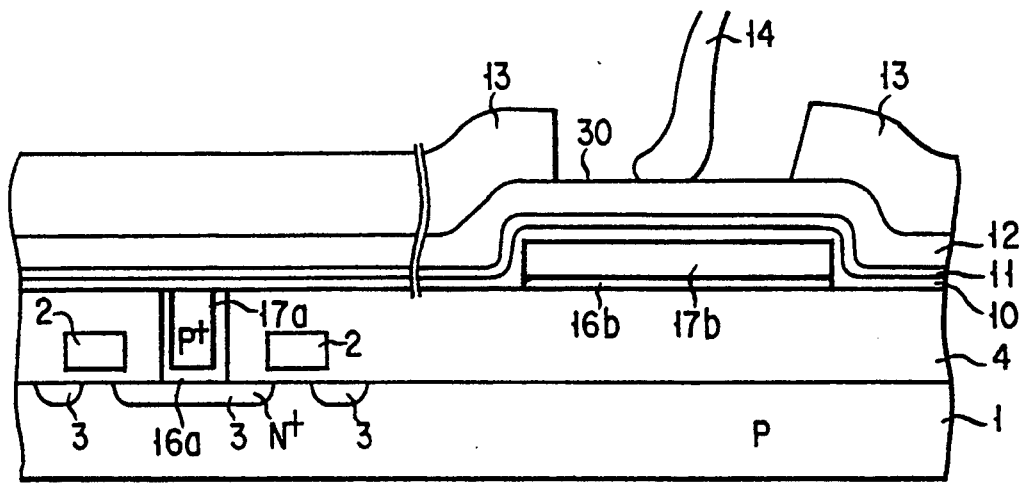
FIG. 9 is a cross section of the semiconductor IC device according to the third embodiment; the process of fabricating a conventional semiconductor IC device according to a fourth embodiment of the present invention.

A third embodiment will be described referring to FIGS. 8A, 8B and 9. The processes of forming a device, such as a transistor, in a predetermined region on the P silicon substrate 1 and forming the contact hole 6 in the BPSG insulating film 4 are the same as those of the first embodiment (see FIGS. 5A and 5B). Then, a tungsten silicide ($WSi_2$) film 16 is deposited several hundreds to several thousands Å thick on the entire surface of the semiconductor substrate 1, followed by the deposition of a phosphorus-doped silicon film 17, as shown in FIG. 8A. Then, as shown in FIG. 8B, the bonding pad portion 30 is masked with a resist, and the phosphorus-doped silicon film 17 and $WSi_2$ film 16 are sequentially etched to form a contact plug 16a, 17a and a pad bed layer 16b, 17b, which is a lamination of the phosphorus-doped silicon film 17 and the $WSi_2$ film 16, on the bonding pad portion 30. Then, as shown in FIG. 9, the laminated wiring of Ti 10, TiN 11 and Al—Si—Cu 12 is formed, that portion of the top passivation film 13 on the wiring which lies on the bonding pad portion 30 is etched out and the lead wire 14 is bonded to the bonding pad portion 30, as per the previous embodiments. The third embodiment also eliminates an additional step of depositing a pad bed layer by allowing the lamination of the phosphorus-doped silicon film as a contact-hole burying material and the $WSi_2$ film to serve also as the pad bed layer, thereby preventing film shearing at the pad portion. Although phosphorus-doped silicon is used in this embodiment, phosphorus diffusion may be carried out to introduce phosphorus after deposition of polysilicon. The $WSi_2$ film 16 underlies the phosphorus-doped silicon film 17 in the third embodiment. The main purpose of providing the $WSi_2$ film 16 is to reduce the resistance of the contact plug and serve as a buffer between the phosphorus-doped silicon 17 in the contact plug in the PMOS (not shown) and the P+-diffusion layer provided in the N-well region (not shown). The same advantage can thus be attached by using metal, such as W or Mo, or its silicide or nitride instead of $WSi_2$. If the effect of lowering the resistance is not significantly large or such is not particularly needed, a layer for isolating the diffusion layer from phosphorus-doped silicon has only to be present on the bottom of the contact hole.

Figure 10A:
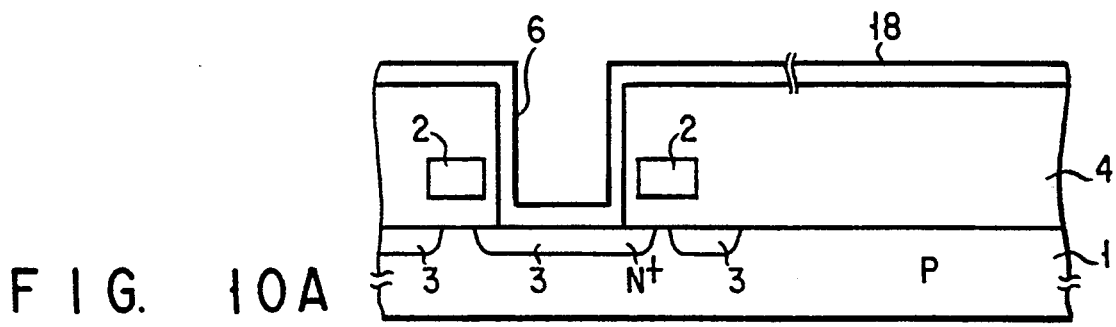
Figure 10B:
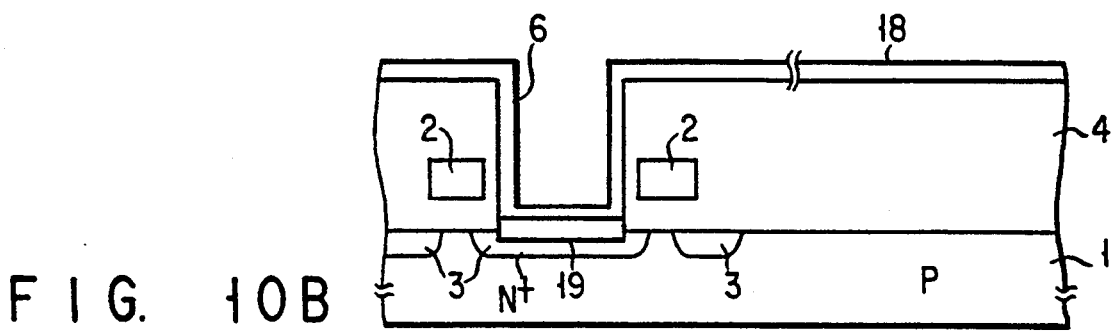
Figure 10C:
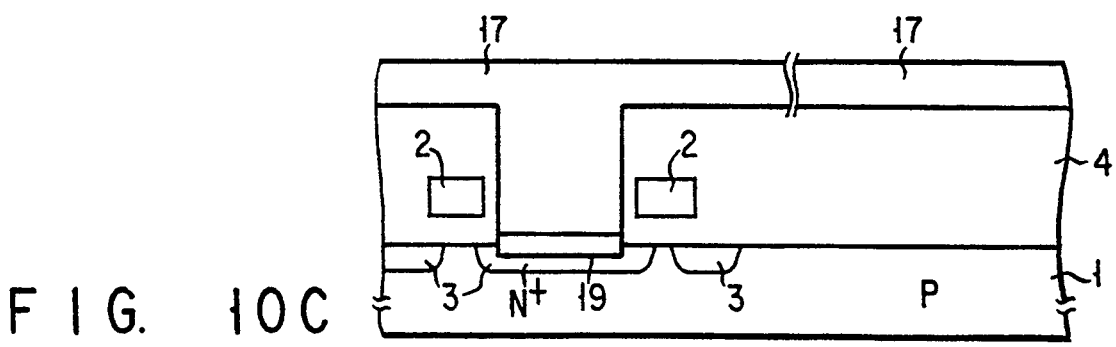
Figure 11:
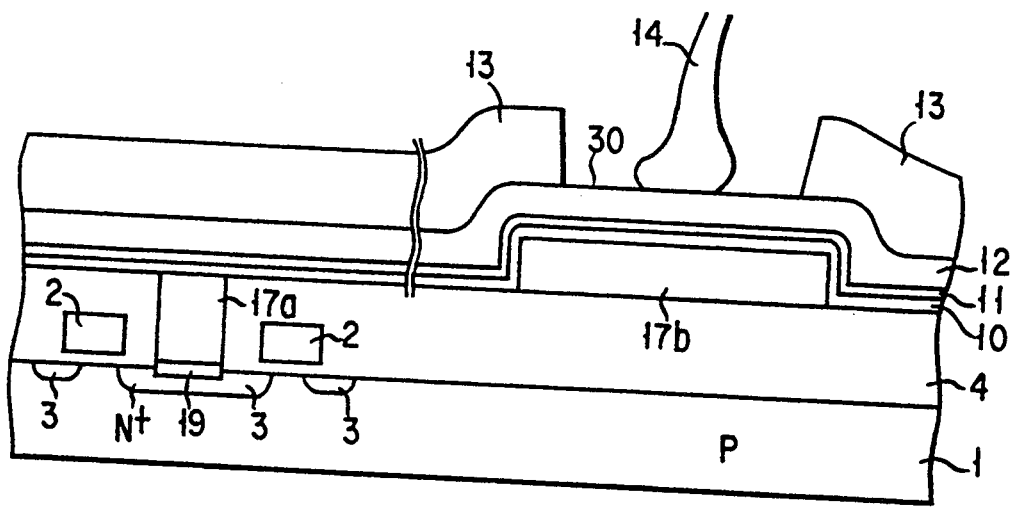
FIG. 11 is a cross section of the semiconductor IC device according to the fourth embodiment.

A fourth embodiment will be described referring to FIGS. 10A to 10C and 11. As shown in FIG. 10A, after the contact hole 6 is formed, for example, a Ti film 18 is deposited on the entire surface of the resultant structure as done in the previous embodiment. Then, only that Ti film 18 which contacts the silicon of the bottom of the contact hole 6 makes a silicide by an ordinary silicide technology, forming a silicide layer 19, as shown in FIG. 10B. Then, only the unreacted Ti film 18 is etched out and a phosphorus-doped silicon film 17 is then deposited, as shown in FIG. 10C. The process of etching the phosphorus-doped silicon film 17 to form a contact plug 17a and a pad bed layer 17b and those following it are the same as those of the third embodiment. The final step of forming the lead wire 14 on the bonding pad portion 30 is illustrated in FIG. 11. In the fourth embodiment, the Ti film 18 deposited on the BPSG film 4 is removed in the final step for the bonding pad portion 30. Even when Ti is used as a silicide as in this embodiment, bond shearing strength will not be deteriorated. The same advantages are also obtainable in this embodiment by using other metals than Ti, such as Mo, W or Co, or lamination of the metal and its nitride, such as TiN/N.

Figure 12:
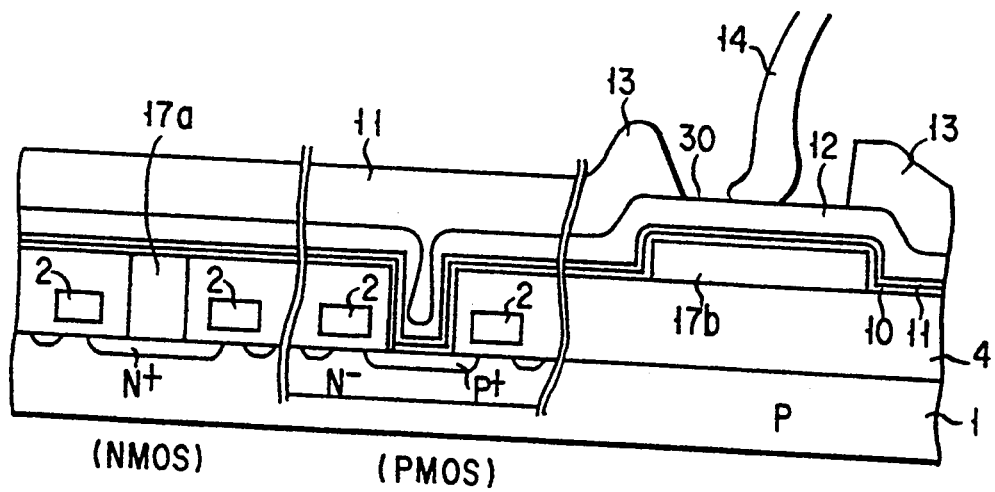
FIG. 12 is a cross section of a semiconductor IC device according to a fifth embodiment of the present invention.

A fifth embodiment will be described referring to FIG. 12. Although a layer of metal or its silicide is formed as a buffer member also to bury N+-silicon in the portion that contacts the P+-diffusion layer in the third and fourth embodiments, such a buffer member is not required in a one-channel MOS device, such as an NMOS device or a device in which contact burying is done only in the NMOS region, because the conductivity can be adjusted. In this case, phosphorus-doped silicon or phosphorus-diffused silicon may be directly formed after the contact hole is formed. In the case of a CMOS device in which contact burying is done only in the NMOS region, after the contact hole is formed only in, for example, the NMOS region (left-hand side in the diagram) and the phosphorus-doped silicon plug and pad bed layer are formed, a contact to a P+-diffusion layer 31 needs to be made to provide a laminated wiring of the Ti film 10, TiN film 11 and Al—Si—Cu film 12. FIG. 12 illustrates the final process in this example. The wiring is buried in the contact hole in the PMOS region, while the phosphorus-doped silicon 17a, the same material as that of the pad bed layer, is buried in the contact hole in the NMOS region. In this manner, the plug material in the contact hole can arbitrarily be selected according to the conductivity of the diffusion layer that should be contacted.

A sixth embodiment will be described referring to FIGS. 13A, 13B and 14. The processes of forming the gate electrode 2, diffusion layer 3, etc. which are needed to form a device, such as a transistor or diode, in a predetermined region on the P silicon substrate 1 and depositing the BPSG insulating film 4 are the same as those of the previous embodiment. In the sixth embodiment, at the time the gate electrode 2 is formed, a buffer layer 20 made of the same material as the gate electrode, such as polysilicon or metal silicide is formed on the bonding pad portion 30 in the same step. It is preferable that a $SiO_2$ film 21 for device isolation, for example, lie under the buffer layer 20 as shown in FIG. 13A. This is not limited to the sixth embodiment, but is true of all the embodiments. But, the bonding pad region need not necessarily lie on the device-isolating $SiO_2$ film but may lie on the same surface as the transistor-forming surface as illustrated in the associated diagrams for the first to fifth embodiments. The contact hole 6 is formed on the diffusion layer 3 using a resist, and a contact hole 6a is also formed on the buffer layer 20 at this time as shown in FIG. 13B. Then, a W film 15a is selectively deposited on the diffusion layer 3, etc. The W film 15b also selectively grows on the buffer layer 20 that is made of the same material as the gate electrode 2. Then, for example, the Ti film 10, TiN film 11 and Al—Si—Cu film 12 are sequentially deposited, the top passivation film 13 is formed on the top of the resultant structure, the bonding pad portion 30 is exposed through the top passivation film 13, and the lead wire 14 is bonded on the W pad bed layer 15b, as shown in FIG. 14. The sixth embodiment also employs a structure that allows the buffer layer 20 and the gate electrode 2 to be made of W which is a contact-hole burying material, eliminating the need to newly form a pad bed layer and thus preventing production of $TiB_x$ that may cause film shearing at the bonding pad portion 30. Although W is used as a contact plug material in this embodiment, the same advantage is obtainable even if another metal, such as Au, Al or Mo is selectively grown or silicon is epitaxially grown. In the latter case, an impurity can be introduced by ion injection or phosphorus diffusion after the contact plug is formed and the contact resistance can be lowered by the above-described manner. Although FIGS. 13 and 14 illustrate a one-layer gate electrode, the gate electrode may have a double-layered structure as in an EPROM. In this case, the buffer layer may have a double-layered structure and may be worked properly to become a single layer as needed.

A seventh embodiment will be described referring to FIGS. 15A, 15B and 16. As shown in FIG. 15A, a device, such as a transistor or diode having the gate electrode 2, diffusion layer 3, etc. is formed in a predetermined region on the P silicon substrate 1, and those elements are covered with the BPSG insulating film 4. At this time, the buffer layer 20 made of the same material as that of the gate electrode 2, e.g., polysilicon, is formed on the bonding pad region. Then, the contact holes 6 and 6a are formed on the N+-diffusion layer 3 and buffer layer 20. The W film 15, for example, is then deposited on the entire surface of the semiconductor substrate 1 by CVD. Subsequently, the contact hole formed on the buffer layer is masked with a resist pattern and the W film 15 is etched back, as shown in FIG. 15B. As a result, W plugs 15a and 15b are formed in the contact hole 6 in the device region or the like and on the buffer layer 20. Then, after the laminated wiring of the Ti film 10, TiN film 11 and Al—Si—Cu film 12 is formed, the top passivation film 13 is deposited on the entire surface of the semiconductor substrate 1, the bonding pad portion 30 is exposed through this film 13 and the lead wire 14 is bonded on the bonding pad portion 30, as shown in FIG. 16. This embodiment, like the sixth embodiment, eliminates the need for separate deposition of the pad bed layer, thus preventing film shearing at the bonding pad portion 30. In this embodiment, when W is etched back to form the contact plug, W (plug 15b) on the buffer layer 20 is masked with a resist. This is simply the matter of etching scheme. In general, etch-back of W is discriminated by detecting and monitoring the material to be etched. Because the ratio of the bonding pad portion to the entire chip area is not small, even the intended etch-back of W is completed, W of the exposed bonding pad portion will be kept etched back and it will be kept monitored. As a result, the discrimination of the end of the etch-back becomes unclear. If the area of the bonding pad portion to the entire chip area is relatively small so that the end of etching can be judged relatively easily on a monitor, or etch-back is carried out on the basis of the etching time that is calculated from the amount of deposition of W and the etching rate, W on the buffer layer 20 may not be masked with a resist. As mentioned earlier, there are several kinds of metals including W and their silicides or silicon as a burying material. Because this material is used for the pad bed layer, it is desirable that the boron concentration of that material be $1 \times 10^{17}$ P/cm$^3$ or below. This is true not only of the seventh embodiment but also of the first to sixth embodiments.

Figure 17:
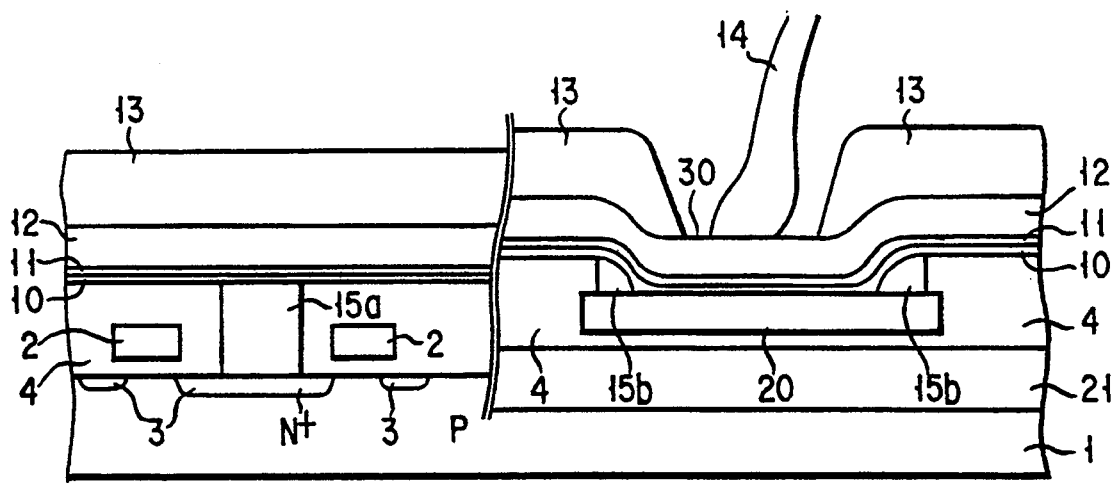
FIG. 17 is a cross section of the semiconductor IC device according to an eighth embodiment of the present invention.

FIG. 17 is a diagram for explaining an eighth embodiment, presenting the cross section of a semiconductor device in which the area of the bonding pad portion to the entire chip area is relatively small. The pad bed layer of this semiconductor device has a different shape than the one shown in FIG. 16. As the W film 15 in the center of the pad bed layer is removed, the area of the bonding pad portion 30 is small, ensuring accurate discrimination of the end of the etch-back. In this case, the Ti wiring 10 is in contact to the buffer layer in the center of the pad bed layer where W does not exist. Although W is used in this embodiment, other metals or their silicides or phosphorus-doped silicon or ion injection may be used as well to provide the same advantage.

Figure 18A:
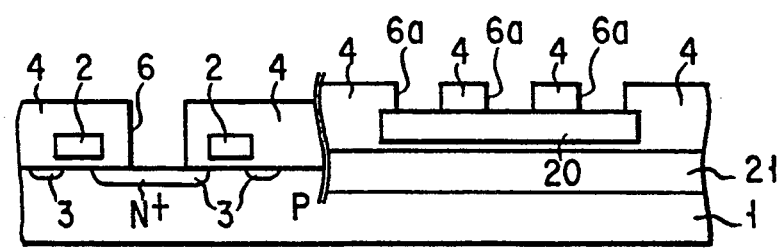
FIGS. 18A and 18B are cross sections for explaining the process of fabricating a conventional semiconductor IC device according to a ninth embodiment of the present invention.
Figure 18B:
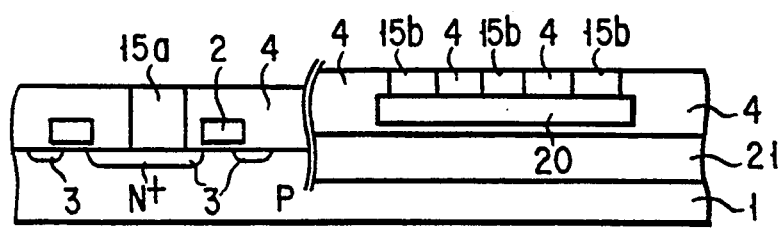
Figure 19:
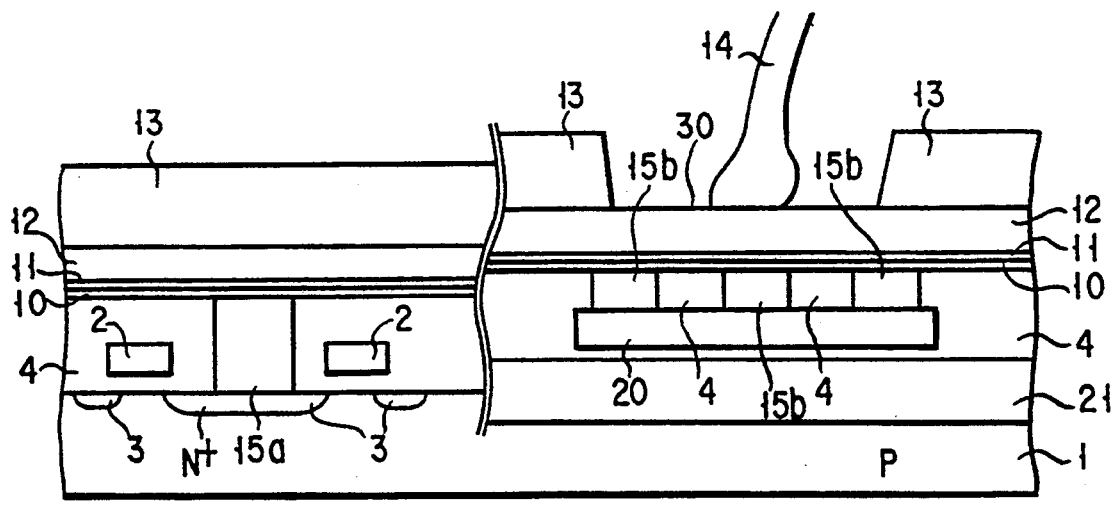
FIG. 19 is a cross section of the semiconductor IC device according to the ninth embodiment.

A ninth embodiment will be described referring to FIGS. 18A, 18B and 19. As in the sixth embodiment, at the time a device, such as a transistor, is formed in a predetermined region on the P-silicon substrate 1, the buffer layer of the same material as that of the gate electrode 2 is formed on the bonding pad portion 30, followed by the deposition of the BPSG insulating film 4. As shown in FIG. 18A, a resist is used to form the contact hole 6 on the diffusion layer 3 and gate electrode 2 (not shown) and to form many contact holes 6a on the buffer layer 20 at the same time in this embodiment. The contact holes 6a should have about a diameter as large as that of the contact hole formed on the diffusion layer 3. Normally, the diameter of the contact hole is 1 $\mu$m or smaller. As shown in FIG. 18B, W 15 is deposited in those holes 6 by CVD or selective growth and is etched back, leaving W 15a and 15b in the contact holes 6 and 6a. After this process come the formation of the laminated wiring of the Ti film 10, TiN film 11 and Al—Si—Cu film 12, the formation of the top passivation film 13 and bonding of the lead wire 14 to the Al alloy wiring 12. As the bonding pad portion 30 is formed on the structure having a mixture of the BPSG insulating film 4 and contact-hole burying materials W 15, the Ti film 10 is firmly at the multiple w portions 15, thereby preventing bonding shearing. Because it is easy to discriminate the end of etch-back through monitor detection, which has been discussed in the section of the seventh embodiment, due to a smaller exposed area than the one in the seventh embodiment, it is unnecessary to mask the bonding pad portion 30 with a resist at the time the etch-back is performed. This can eliminate the need for a photoresist step that is required in the seventh embodiment. As in the previously described embodiments, other metals than W, such as Mo and Al or their silicides or silicon may be used as well to provide the same advantage.

The foregoing description has been given with reference to the case where the contact plug in the contact hole and the pad bed layer are made of the same material.

The following will discuss embodiments having a structure which does not cause the plug to contact the pad bed layer during the fabrication and in the case where a protective film is formed on the pad bed layer.

Figure 20A:
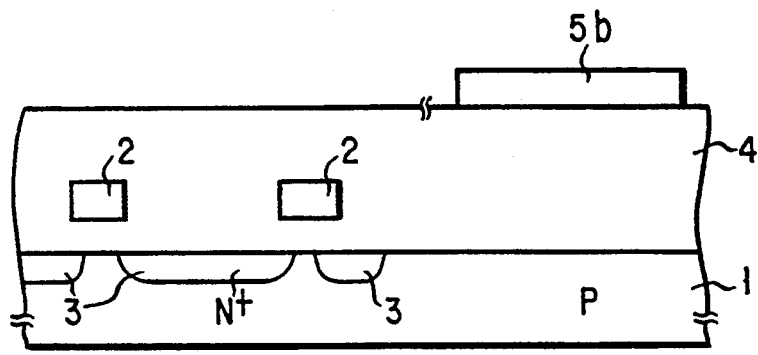
FIGS. 20A to 20D are cross sections for explaining the process of fabricating a conventional semiconductor IC device according to a tenth embodiment of the present invention.
Figure 20B:
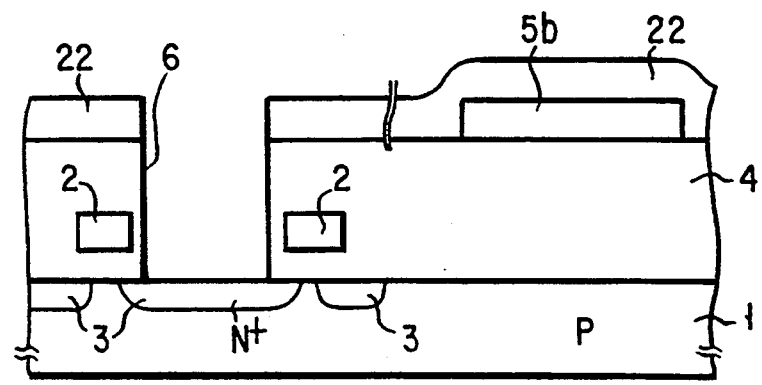
Figure 20C:
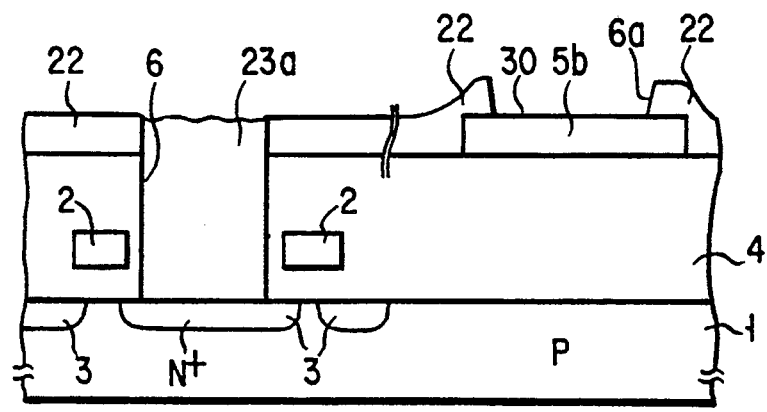
Figure 20D:
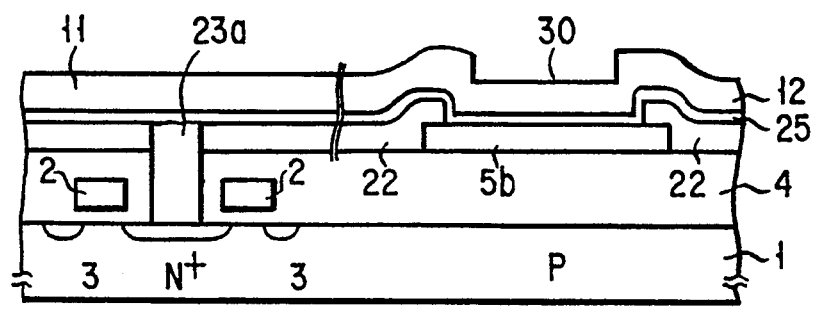
Figure 21:
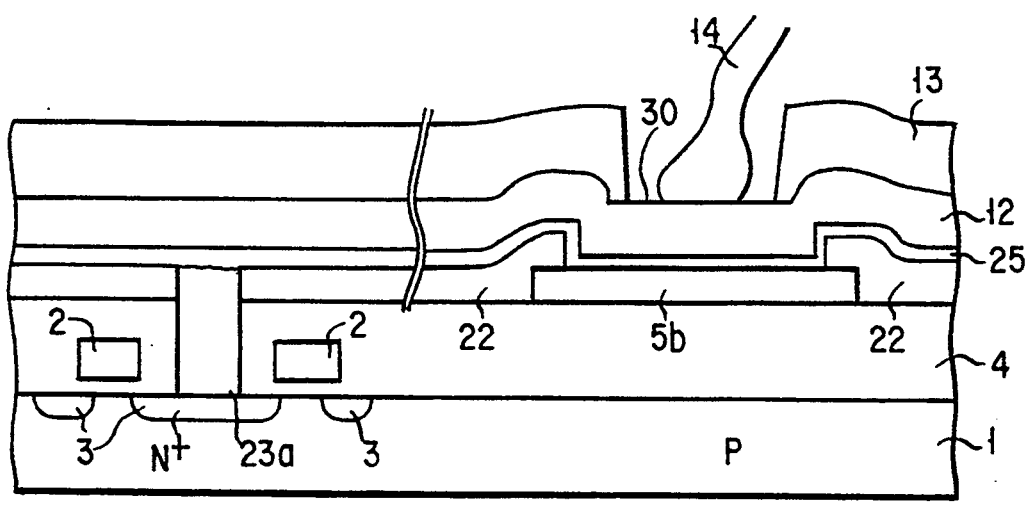
FIG. 21 is a cross section of the semiconductor IC device according to the tenth embodiment.

A tenth embodiment will be described referring to FIGS. 20A to 20D and 21. The gate electrode 2 and N+-diffusion layer 3, which are needed to form a device, such as a transistor or diode, are formed in a predetermined region on the P silicon substrate 1 and the BPSG insulating film 4 is then deposited on the resultant structure. In the diagrams, the left half portion shows a semiconductor circuit region, and the right half the bonding pad portion 30 which electrically connects the lead wire to an internal circuit in the semiconductor chip. A polysilicon layer 5 is formed on the entire BPSG insulating film 4 by, for example, LPCVD. As shown in FIG. 20A, the resultant structure is patterned using a resist, the polysilicon layer 5 is etched by anisotropic ion etching such as RIE, yielding a pad bed layer 5b, and the resist is then removed. A BPSG film 22 is then deposited about 1000 to 3000 Å thick on the entire surface of the semiconductor substrate 1, as shown in FIG. 20B. Then, the contact opening portion is patterned using a resist, and a BPSG film 22 and the BPSG insulating film 4 are sequentially etched by, for example, anisotropic ion etching, forming the contact hole 6. Next, W is selectively grown in the contact hole 6 by selective CVD, forming a W plug 23a, as shown in FIG. 20C. Although FIG. 20C illustrates an example in which W is selectively grown on the contact opening portion 6 where the surface of the diffusion layer 3 is exposed, W is also grown in the region (gate-like contact hole, etc.) where the surface of the gate electrode 2 or the like formed of polysilicon or a high melting-point metal silicide is exposed. Since the BPSG film 22 covers around the pad bed layer 5, it is possible to prevent unintended W from being grown on the pad bed layer 5. Then, part of the BPSG film 22 is etched out to open part of the pad bed layer 5, forming an opening 9. Next, a laminated metal wiring consisting of a laminated barrier metal 25 having a Ti/TiN structure and the Al—Si—Cu film 12 is formed as shown in FIG. 20D. In the bonding pad portion 30, the laminated wiring 12, 25 is used as a bonding pad. In this region, therefore, the lowermost Ti film 25 of the laminated wiring 12, 25 contacts the aforementioned pad bed layer 5b. Next, the top passivation film 13 is deposited, an opening is formed in part of the bonding pad, and then, the lead wire 14 is bonded on the bonding pad portion 30 in the assembly process. According to the tenth embodiment, as the pad bed layer 5b containing no boron lies between the Ti film 25 of the laminated wiring and the BPSG insulating film 4 at the bonding pad portion 30, when the tensile stress is externally applied via the lead wire 14, it is possible to prevent the film shearing which would otherwise possibly occur at the boundary between the Ti film 25 and the BPSG film 4. In addition, as the pad bed layer 5b is covered with the BPSG film 22 at the time the W plug 23a is selectively grown, unintended growth of W at the pad bed portion can be avoided. While polysilicon is described as an example of the material for the pad bed layer, other various kinds of materials including a high melting-point metal and a silicide are also available. From the view point of the shearing strength, it is desirable that the boron concentration in the material be $1 \times 10^{17}$ P/cm$^3$ or below. This is true of the twelfth, fourteenth, sixteenth, eighteenth, twentieth and twenty-second embodiments which will be described later. If the boron concentration of the material for the pad bed layer is as low as the mentioned level, the boron concentration of the contact-hole burying material or contact plug can be arbitrarily selected, thus facilitating the selection of the material for the pad bed layer. Although a BPSG film is used as an example of the film 22 to cover the pad bed layer 5b in the tenth embodiment, the same advantage is of course expected if the film is a CVD oxide film or a material that has a property to make selective growth of W difficult. Although W is selectively grown as the burying material for the contact hole, the same advantage can be expected if other high melting-point metals known as a selectively growable material or epitaxial growth of silicon is employed. This is true of the embodiments which will be described later.

Figure 22A:
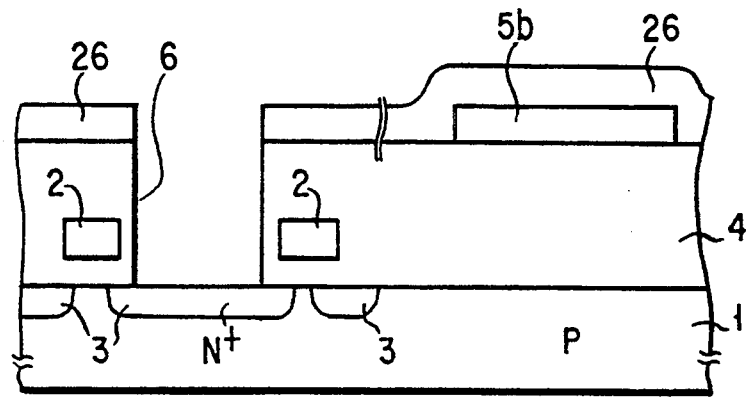
FIGS. 22A and 22B are cross sections for explaining the process of fabricating a conventional semiconductor IC device according to an eleventh embodiment of the present invention.
Figure 22B:
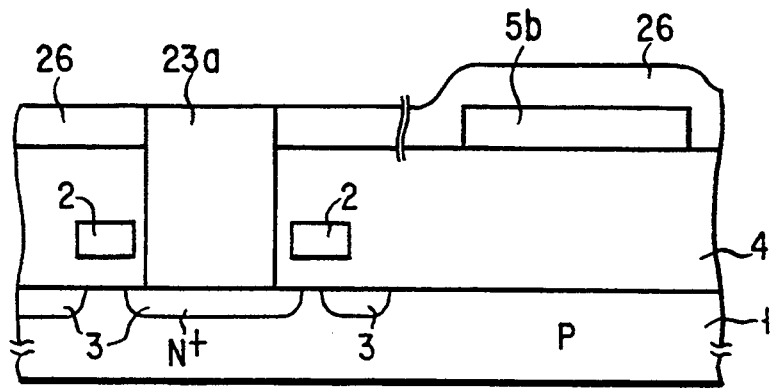
Figure 23:
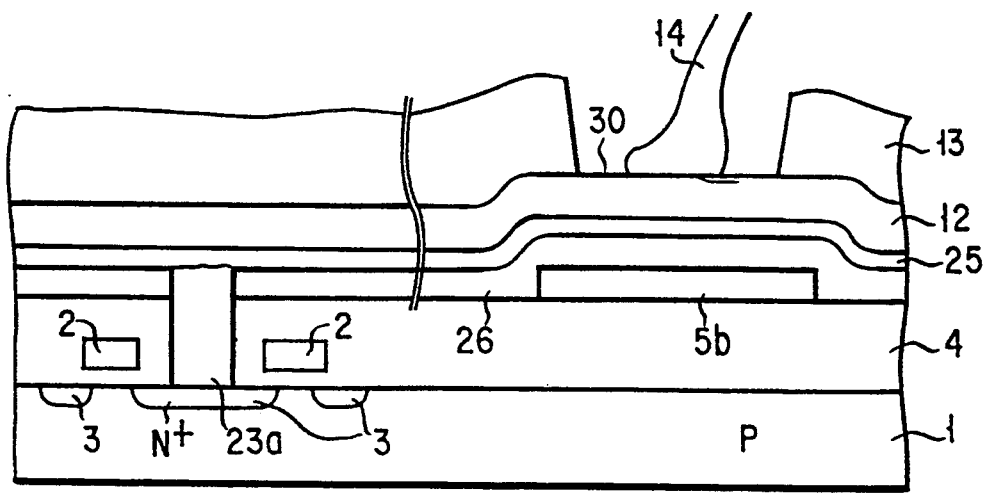
FIG. 23 is a cross section of the semiconductor IC device according to the eleventh embodiment.

An eleventh embodiment will be described referring to FIGS. 22A, 22B and 23. The gate electrode 2 and N+-diffusion layer 3, which are needed to form a device, such as a transistor or diode, are formed in the device region on the P silicon substrate 1 and the BPSG insulating film 4 is then deposited on the semiconductor substrate 1. The polysilicon layer 5 is formed on the entire BPSG insulating film 4 by, for example, LPCVD, as shown in FIG. 22A. Then, the resultant structure is patterned using a resist, the polysilicon layer 5 is etched by anisotropic ion etching such as RIE, yielding the pad bed layer 5b, and the resist is then removed. A CVD oxide film 26 is then deposited about 1000 to 3000 Å thick on the entire surface of the semiconductor substrate 1. Next, the contact opening portion is patterned using a resist, and the CVD oxide film 26 and the BPSG insulating film 4 are selectively etched in order by, for example, anisotropic ion etching, forming the contact hole 6. Then, W is selectively grown in the contact hole 6 by selective CVD, forming the W plug 23a, as shown in FIG. 22B. Although the W 23a is selectively grown in the contact hole 6 in FIG. 22B, it may also be grown on the gate contact as needed. Subsequently, a laminated metal wiring consisting of a laminated barrier metal 25 having a Ti/TiN structure and the Al—Si—Cu film 12 from the bottom is formed, the top passivation film 13 is deposited on the resultant structure, followed by the formation of an opening in part of the bonding pad, and then, the lead wire 14 is bonded on the bonding pad portion 30 in the assembly process, as shown in FIG. 23. Because the pad bed layer 5b is covered with the CVD oxide film 26 in the W growing process also in the eleventh embodiment, undesirable growth of W on the pad bed layer can be avoided. Further, according to the eleventh embodiment, unlike in the tenth embodiment, part of the pad bed layer 5b is not exposed at the bonding pad portion 30. As it is with the CVD oxide film containing no boron which is in contact with the lowermost Ti film of the laminated wiring, film shearing can be prevented. Although a CVD oxide film is used as the film 26 to cover the pad bed layer 5b in this embodiment, the same advantage can be expected by the use of another material as long as its boron concentration is as low as, for example, $1 \times 10^{17}$ P/cm$^3$ or below, and it makes growth of W difficult and has a high adhesion.

Figure 24A:
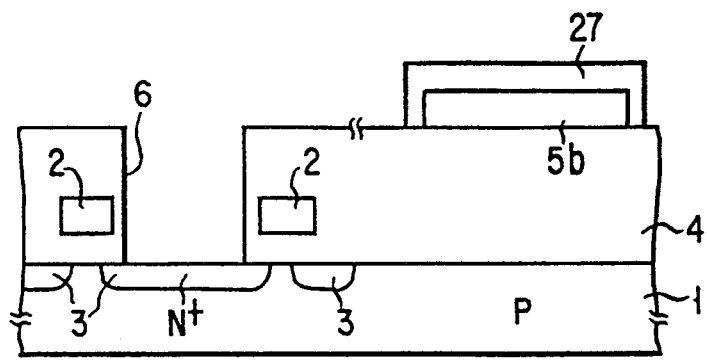
FIGS. 24A and 24B are cross sections for explaining the process of fabricating a conventional semiconductor IC device according to a twelfth embodiment of the present invention.
Figure 24B:
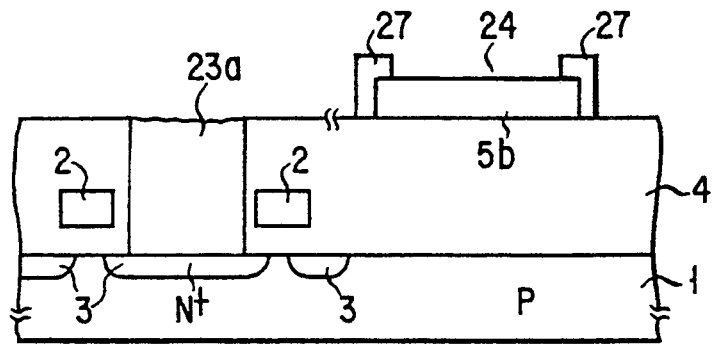
Figure 25:
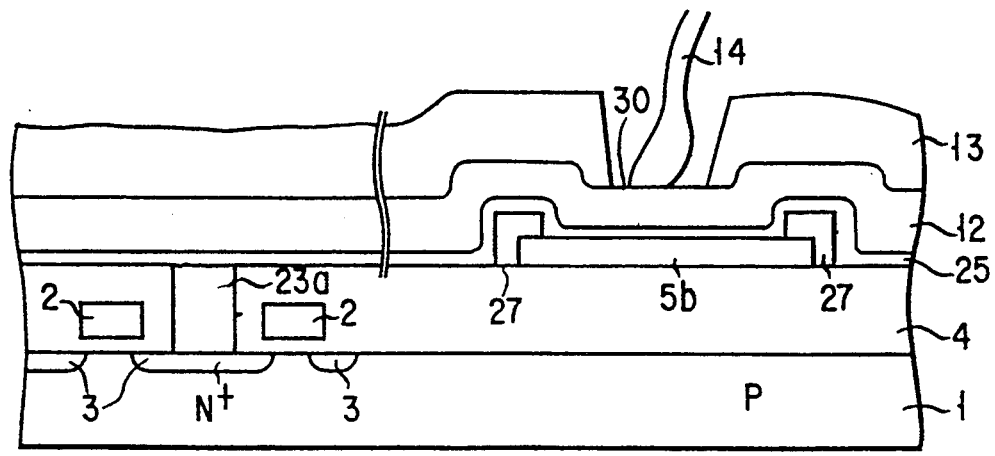
FIG. 25 is a cross section of the semiconductor IC device according to the twelfth embodiment.

A twelfth embodiment will be described referring to FIGS. 24A, 24B and 25. The gate electrode 2 and N+-diffusion layer 3 are provided in the device region on the P silicon substrate 1 to form a device, such as a transistor or diode, and the BPSG insulating film 4 is then deposited on the semiconductor substrate 1. The polysilicon layer 5 is formed on the entire BPSG insulating film 4 by, for example, LPCVD, as shown in FIG. 24A. Then, the resultant structure is patterned using a resist, the polysilicon layer 5 is etched by anisotropic ion etching such as RIE, yielding the pad bed layer 5b, and the resist is then removed. Next, the surface of the pad bed layer 5b consisting of a polysilicon film is subjected to thermal oxidization to oxide the surface, covering the surface with a thermal oxide film 27, as shown in FIG. 24B. Next, the contact opening portion is patterned using a resist, and the CVD oxide film 26 and the BPSG insulating film 4 are selectively etched by anisotropic ion etching, forming the contact hole 6. Then, W is selectively grown in the contact hole 6 by selective CVD, forming the W plug 23a. Although the W 23a is selectively grown in the contact hole 6, it may also be grown on the gate contact as needed. Part of the thermal oxide film 27 is etched out to form an opening 24 in the center of the pad bed layer 5b. Subsequently, a laminated wiring consisting of a laminated barrier metal 25 having a Ti/TiN structure and the Al—Si—Cu film 12 from the bottom is formed, the top passivation film 13 is deposited on the resultant structure, followed by the formation of an opening in part of the bonding pad, and then, the lead wire 14 is bonded on the bonding pad portion 30 in the assembly process, as shown in FIG. 25. Because the pad bed layer 5b is covered with the thermal oxide film 27 in the W growing process, unintended growth of W on the pad bed layer can be avoided. Further, since part of the pad bed layer 5b is exposed at the bonding pad portion 30 and the laminated wiring is made to closely contact there, the lowermost Ti film of the laminated wiring is in contact to the pad bed layer 5b which does not contain boron. It is thus possible to avoid film shearing at the bonding pad portion 30.

A thirteenth embodiment will be described referring to FIG. 26. While an opening is formed in part of the thermal oxide film 27 to expose the surface of the pad bed layer 5b in the twelfth embodiment, the laminated wiring may be formed on the pad bed layer 5b covered with the thermal oxide film 27 without forming any opening in the thermal oxide film 27 by etching. The thirteenth embodiment concerns with this case. The bonding pad portion 30 is formed at the opening in the laminated wiring, which consists of the laminated barrier metal 25 having a Ti/TiN structure, and the lead wire 14 is connected to that portion 30. The pad bed layer 5b is completely covered with the thermal oxide film 27 and the thermal oxide film 27 which is in contact with the Ti film 25 of the laminated wiring does not contain boron. In this case also, it is possible to avoid the occurrence of film shearing and prevent abnormal growth of W at the pad bed portion. The plug 23a in the contact hole 6 is made of W.

Figure 27C:
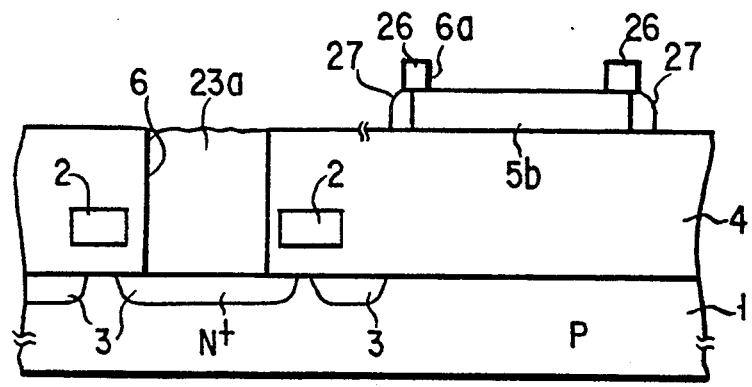
Figure 27D:
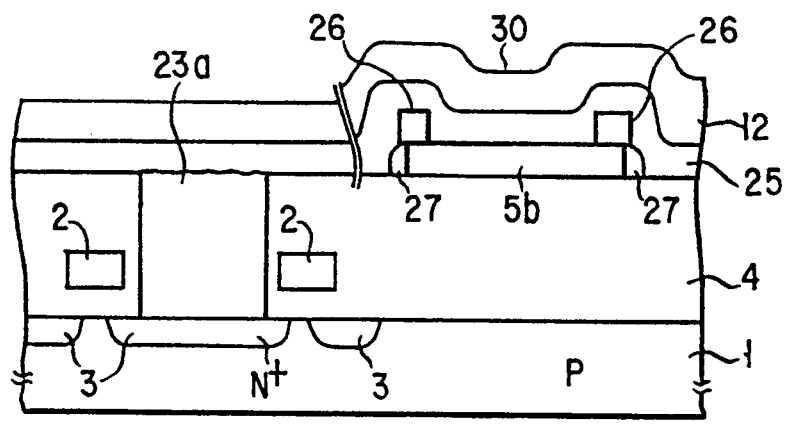
Figure 28:
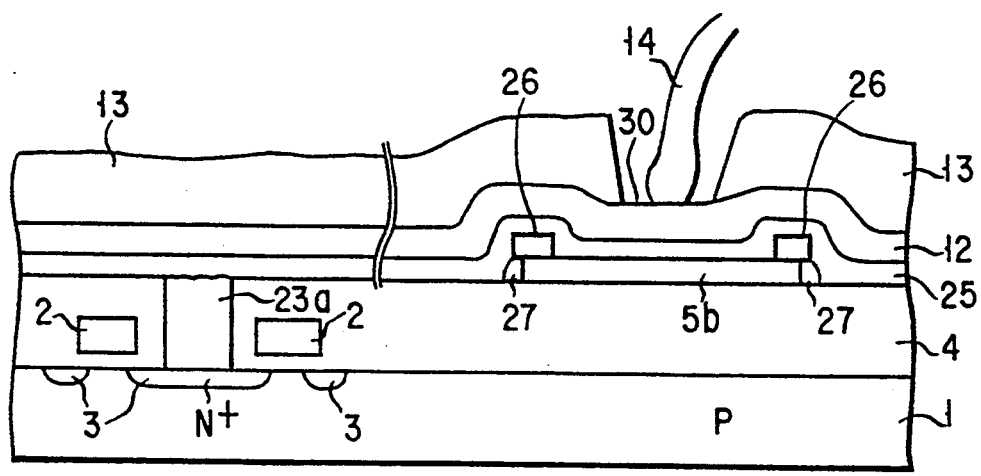
FIG. 28 is a cross section of the semiconductor IC device according to the fourteenth embodiment of the invention.

A fourteenth embodiment will be described referring to FIGS. 27A to 27D and 28. The gate electrode 2 and N+-diffusion layer 3 are formed in the device region on the P silicon substrate 1 to form a device, and the BPSG insulating film 4 is then deposited on the semiconductor substrate 1. The polysilicon layer 5 is formed on the entire BPSG insulating film 4 by, for example, LPCVD, as shown in FIG. 27A. Then, the CVD oxide film 26, for example, is deposited on the entire surface of the polysilicon film 5. Next, as shown in FIG. 27B, the resultant structure is patterned using a resist, and the CVD oxide film 26 and the polysilicon layer 5 are sequentially etched by anisotropic ion etching such as RIE, yielding the pad bed layer 5b, and the resist is then removed. At this time, the top of the pad bed layer 5b is covered with the CVD oxide film 26 which has been processed at the same time as the processing of this pad bed layer. Next, the exposed portion on the side of the pad bed layer 5b formed of polysilicon is oxidized by thermal oxidization, forming the thermal oxide film 27. Then, the contact opening portion is patterned using a resist, and the BPSG insulating film 4 is etched by anisotropic ion etching, forming the contact hole 6. Then, W is selectively grown in the contact hole 6 by selective CVD, forming the W plug 23a, as shown in FIG. 22B. Although the W 23a is selectively grown in the contact hole 6 in FIG. 27C, it may also be grown on the gate contact as needed. Part of the CVD oxide film 26 is then etched out to form an opening 6a in the center of the pad bed layer 5b. Subsequently, a laminated metal wiring consisting of a laminated barrier metal 25 having a Ti/TiN structure and the Al—Si—Cu film 12 from the bottom is formed, as shown in FIG. 27D. As shown in FIG. 28, after the top passivation film 13 is deposited on the resultant structure and is etched to yield the bonding pad portion 30, the lead wire 14 is bonded on the bonding pad portion 30 in the assembly process. Because the pad bed layer 5b is fully covered with the CVD oxide film 26 in the W growing process, the occurrence of film shearing can be suppressed and the undesirable growth of W on the pad bed layer can be avoided.

Figure 29:
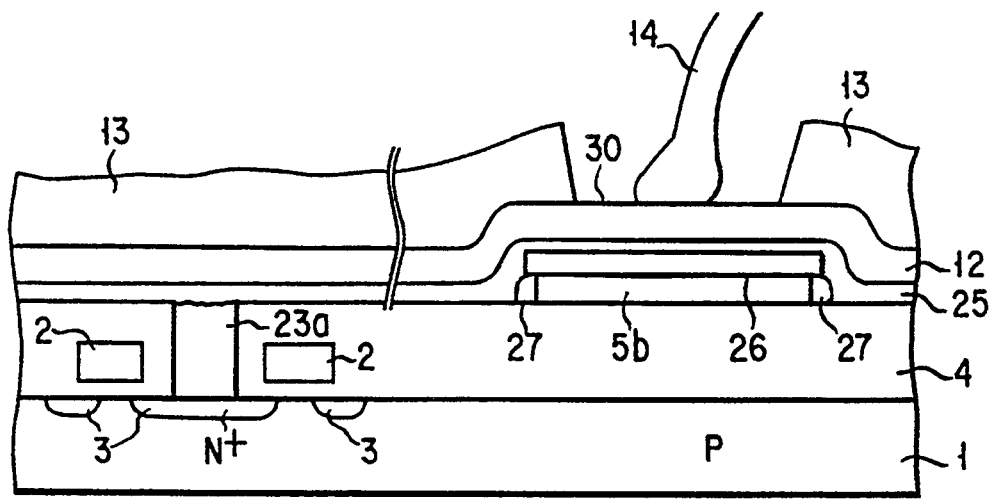
FIG. 29 is a cross section of a semiconductor IC device according to a 15th embodiment of the invention.

A fifteenth embodiment will be described referring to FIG. 29. This embodiment differs from the fourteenth embodiment in that the protective film or coating film 26 on the pad bed layer 5 completely covers the surface of the pad bed layer. If the coating film 26 contains boron like the BPSG film, that portion of the coating film 26 which corresponds to the center of the pad bed layer 5 should be removed to avoid contact of the coating film 26 with the Ti film which is included in the laminated wiring. But, if the coating film, like the CVD oxide film, is made of a material which contains no boron, the same advantage as obtained in the previous embodiment can be expected without exposing the pad bed layer 5 at the bonding pad portion 30. In the fifteenth embodiment, the thermal oxide film 27 lies on the side of the pad bed layer 5, and a CVD SiO₂ film is formed as the protective film 26 on the top of the layer 5.

Figure 30A:
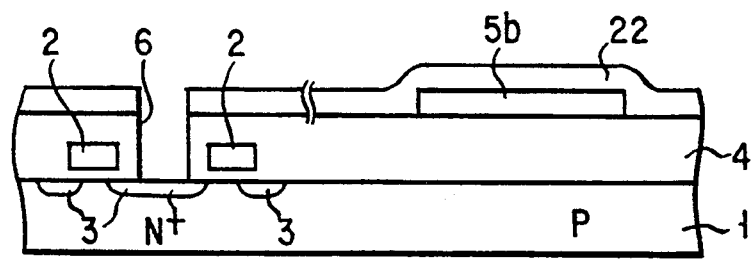
FIGS. 30A and 30B are cross sections for explaining the process of fabricating a semiconductor IC device according to a 16th embodiment of the invention.
Figure 30B:
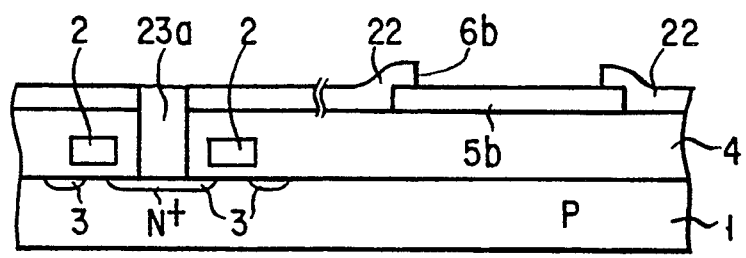
Figure 31:
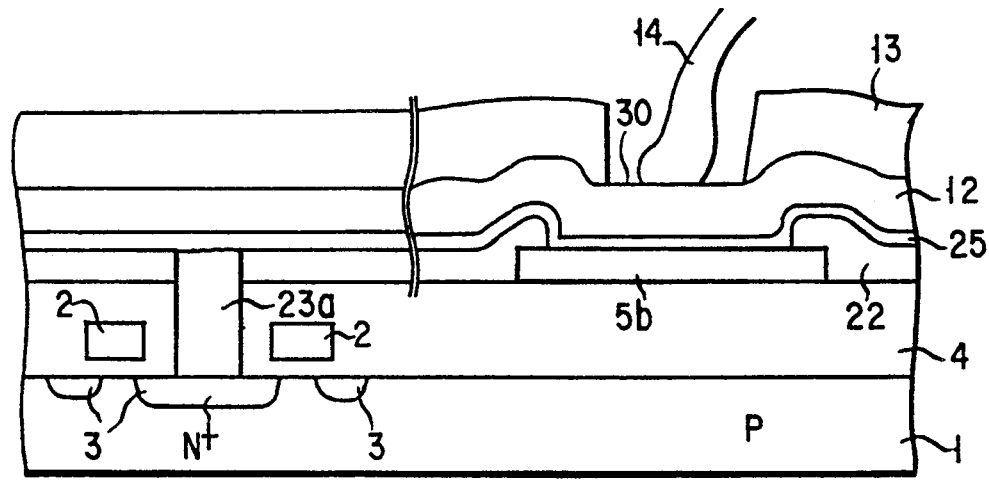
FIG. 31 is a cross section of the semiconductor IC device according to the 16th embodiment of the invention.

A sixteenth embodiment will be described referring to FIGS. 30A, 30B and 31. The gate electrode 2 and N+-diffusion layer 3 are formed in the device region on the P silicon substrate 1 to form a device, followed by the deposition of the BPSG insulating film 4 on the semiconductor substrate 1. The polysilicon layer 5 is formed on the entire BPSG insulating film 4 by, for example, LPCVD, as shown in FIG. 30A. Then, the resultant structure is patterned using a resist, the polysilicon layer 5 is etched by anisotropic ion etching such as RIE, yielding the pad bed layer 5b, and the resist is then removed. The BPSG film 22 is then deposited about 1000 to 3000 Å thick on the entire surface of the semiconductor substrate 1. Next, the contact forming portion is patterned using a resist, and the BPSG film 22 and the BPSG insulating film 4 are selectively etched in order by anisotropic ion etching, forming the contact hole 6. Then, W 23 is deposited on the entire surface of the resultant structure to fill the contact hole 6, as shown in FIG. 30B. Then, the W 23 is fully etched back. As a result, the buried W plug 23a is formed in the contact hole 6. Next, part of the BPSG film 22 is etched out to form an opening 6b in part of the pad bed layer 5. Subsequently, a laminated metal wiring consisting of a laminated barrier metal 25 having a Ti/TiN structure and the Al—Si—Cu film 12 from the bottom is formed, as shown in FIG. 31. Then, the top passivation film 13 is deposited on the resultant structure, followed by the formation of an opening in that portion of the film 13 which corresponds to the bonding pad portion 30, and then, the lead wire 14 is bonded on the bonding pad portion 30 in the assembly process. Because the pad bed layer 5b is covered with the BPSG film 22 having an etching rate greatly different from that of W at the time the deposit W 23 is etched back in the sixteenth embodiment, the pad bed layer 5b is prevented from being etched. Further, as the Ti film 25 of the laminated wiring contacts the pad bed layer 5b at the bonding pad portion 30, the occurrence of film shearing can be prevented. Although a BPSG film is used as the coating film 22 formed on the pad bed layer 5b, the same advantage can be expected by the use of a CVD oxide film or other materials which are difficult to be etched at the time of etching back W (i.e., which have a lower etching rate than W). Although the sixteenth embodiment employs W as the contact-hole burying material, the same advantage can be expected by the use of other materials, such as high melting-point metals and their silicides or silicon which contains boron and phosphorus having a concentration of $1 \times 10^{20}$ P/cm$^3$ or below, In that case, the pad bed coating film 22 may be formed of a material that matches the burying material in order to prevent the underlying pad bed layer 56 from being etched. While the description of the following embodiments will be given with the case where W is used as an example of the burying material, the same advantage of this embodiment is also obtainable in the following embodiments by the use of other materials than W.

Figure 32:
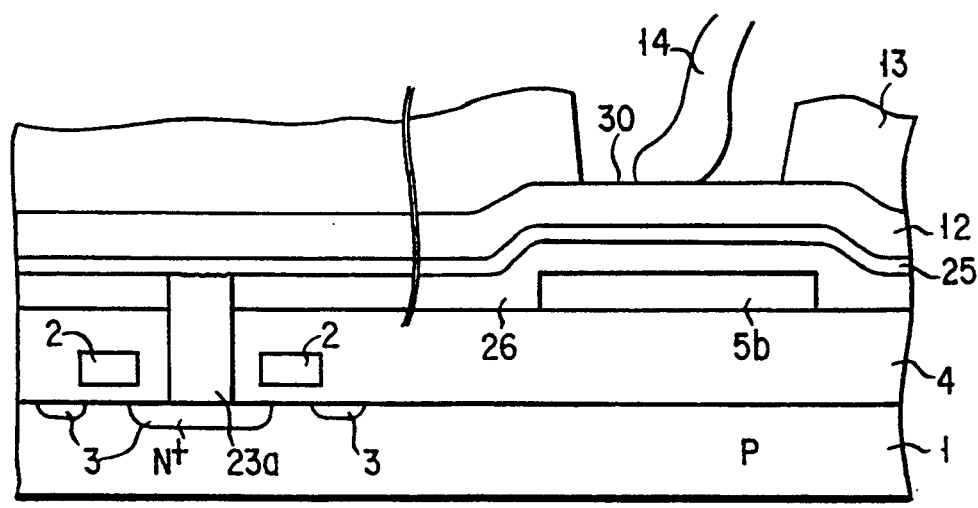
FIG. 32 is a cross section of a semiconductor IC device according to a 17th embodiment of the invention.

A seventeenth embodiment will be described referring to FIG. 32. This embodiment differs from the sixteenth embodiment in that the protective film or coating film 26 on the pad bed layer 5 completely covers the surface of the pad bed layer. If the coating film 26 contains boron like the BPSG film, that portion of the coating film 26 which corresponds to the center of the pad bed layer 5 should be removed to avoid contact of the coating film 26 with the Ti film which is included in the laminated wiring. But, if the coating film, like the CVD oxide film, is made of a material which contains no boron, the same advantage as obtained in the previous embodiment can be expected without exposing the pad bed layer 5 at the bonding pad portion 30. In the fifteenth embodiment, the thermal oxide film 27 lies on the side of the pad bed layer 5, and a CVD SiO$_2$ film is formed as the protective film 26 on the top of the layer 5. The pad bed layer is protected at the time the burying material is etched back and the bonding shearing can be prevented in this manner.

An eighteenth embodiment will be described referring to FIGS. 33A, 33B and 34. The gate electrode 2 and N+-diffusion layer 3 are formed in the device region on the P-silicon substrate 1 to form a device, followed by the deposition of the BPSG insulating film 4 on the semiconductor substrate 1. The polysilicon layer 5 is formed on the entire BPSG insulating film 4 by, for example, LPCVD, as shown in FIG. 33A. Then, the resultant structure is patterned using a resist, the polysilicon layer 5 is etched by anisotropic ion etching such as RIE, yielding the pad bed layer 5b, and the resist is then removed. The surface of the pad bed layer 5b of polysilicon is oxidized by thermal oxidization, covering the polysilicon film 5b with the thermal oxide film 27. Next, the contact forming portion is patterned using a resist, and the thermal oxide film 27 and the BPSG insulating film 4 are selectively etched in order by anisotropic ion etching, forming the contact hole 6. Then, W 23 is deposited on the entire surface of the resultant structure to fill the contact hole 6, as shown in FIG. 33B. Then, the W 23 is fully etched back. As a result, the buried W plug 23a is formed in the contact hole 6. Next, part of the thermal oxide film 27 is etched out to form an opening 24 in part of the pad bed layer 5. Subsequently, a laminated metal wiring consisting of a laminated barrier metal 25 having a Ti/TiN structure and the Al—Si—Cu film 12 from the bottom is formed, as shown in FIG. 34. Then, the top passivation film 13 is deposited on the resultant structure, followed by the formation of an opening in that portion of the film 13 which corresponds to the bonding pad portion 30, and then, the lead wire 14 is bonded on the bonding pad portion 30 in the assembly process. The pad bed layer 5b is covered with the thermal oxide film 27 having an etching rate greatly different from that of W 23 at the time the deposit W 23 is etched back, the pad bed layer 5b is prevented from being etched. Further, as the Ti film 25 of the laminated wiring contacts the pad bed layer 5b at the bonding pad portion 30, the occurrence of film shearing can be prevented.

Figure 35:
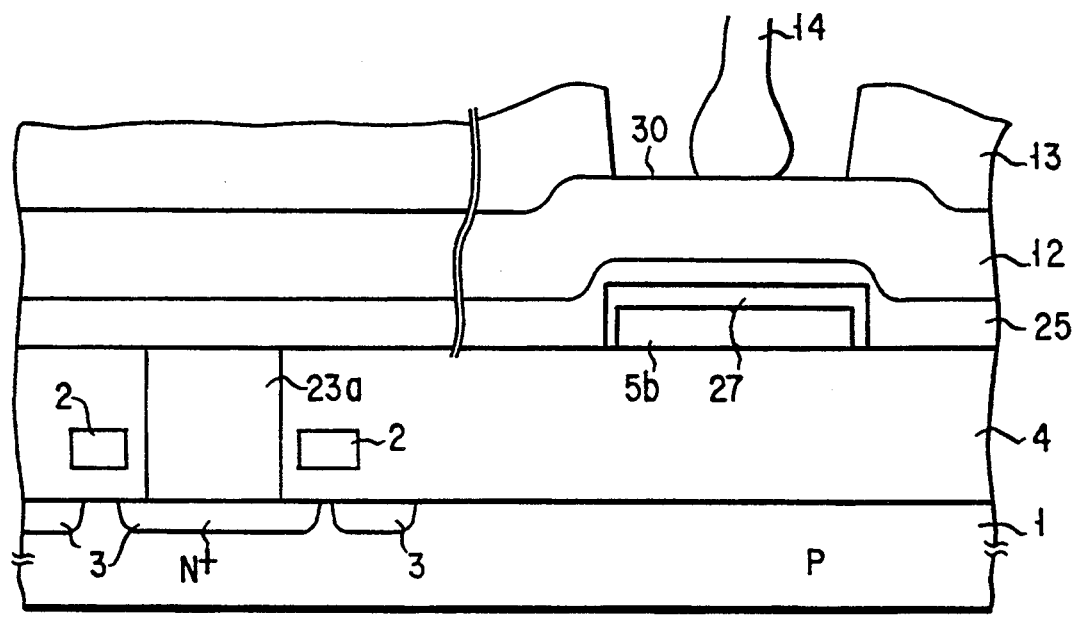
FIG. 35 is a cross section of a semiconductor IC device according to a 19th embodiment of the invention.

A nineteenth embodiment will be described referring to FIG. 35. A thermal oxide film is used as an example of the coating film 27 for the pad bed layer 5 in the eighteenth embodiment. Since this film does not contain boron, the occurrence of film shearing can be avoided even with the pad bed layer 5b covered with the coating film 27 to show no exposed portion of the pad bed layer 5b at the bonding pad portion 30. FIG. 35 illustrates the cross section of this embodiment in the final fabrication process. The same advantage as provided in the previous embodiment can be attained also in the nineteenth embodiment.

Figure 36A:
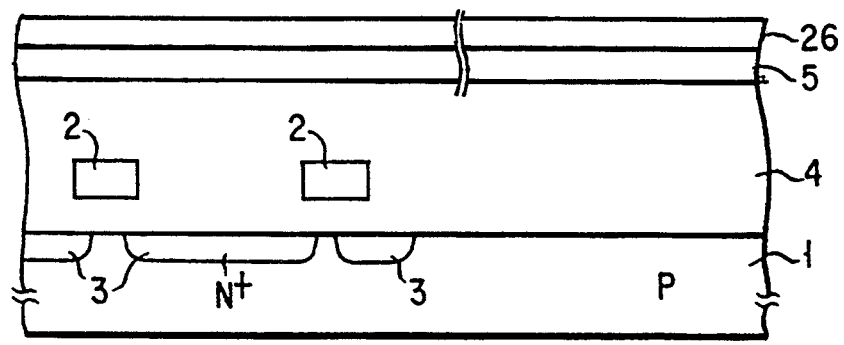
FIGS. 36A to 36D are cross sections for explaining the process of fabricating a semiconductor IC device according to a 20th embodiment of the invention; device according to the 20th embodiment of the invention.
Figure 36B:
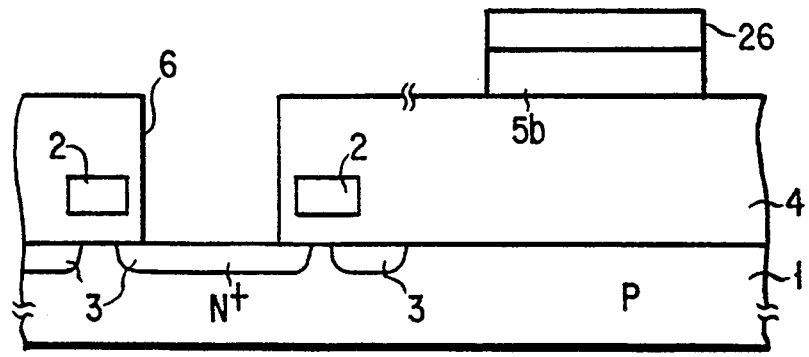
Figure 36C:
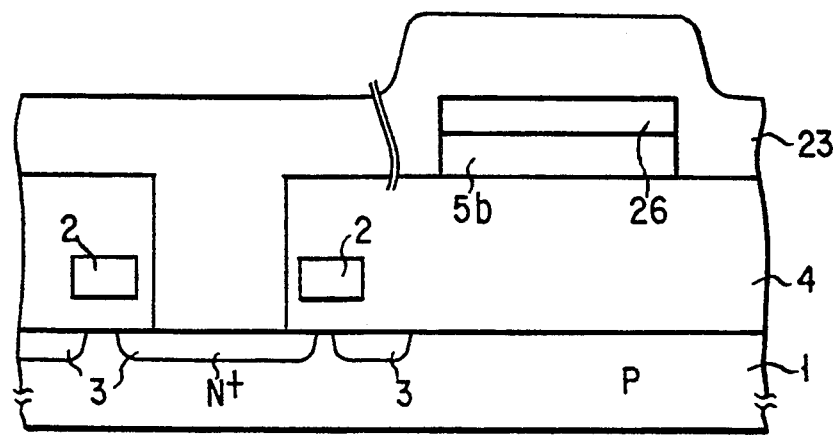
Figure 36D:
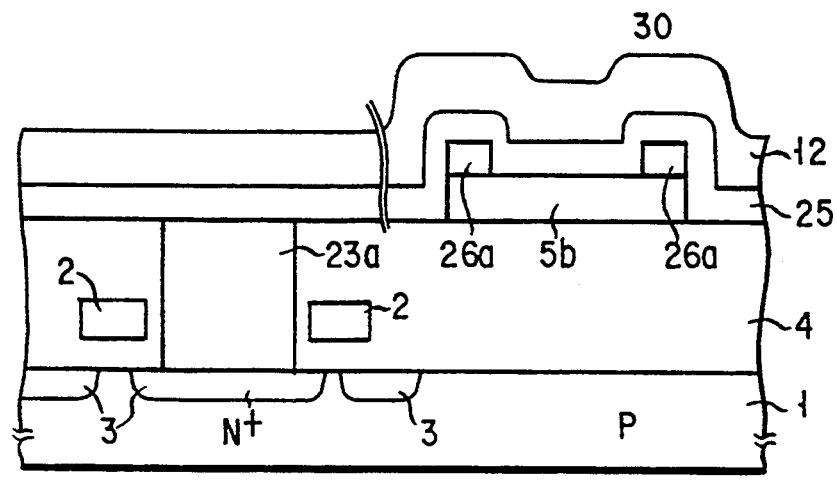

A twentieth embodiment will be described referring to FIGS. 36A to 36D and 37. The gate electrode 2 and N+-diffusion layer 3 are formed in the device region on the P silicon substrate 1 to form a device, and the BPSG insulating film 4 is then deposited on the semiconductor substrate 1. The polysilicon layer 5 is formed on the entire BPSG insulating film 4 by, for example, LPCVD, as shown in FIG. 36A. Then, the CVD oxide film 26, for example, is deposited on the entire surface of the polysilicon film 5. Next, as shown in FIG. 36B, the resultant structure is patterned using a resist, and the CVD oxide film 26 and the polysilicon layer 5 are sequentially etched by anisotropic ion etching such as RIE, yielding the pad bed layer 5b, and the resist is then removed. At this time, the top of the pad bed layer 5b is covered with the CVD oxide film 26 which has been processed at the same time as the processing of this pad bed layer. Then, the contact opening portion is patterned using a resist, and the BPSG insulating film 4 is etched by anisotropic ion etching, forming the contact hole 6. Then, W 23 is deposited on the entire surface of the resultant structure to fill the contact hole 6, as shown in FIG. 36C. Then, the W 23 is fully etched back. As a result, the buried W plug 23a is formed in the contact hole 6, as shown in FIG. 36D. Next, part of the CVD oxide film 26 is etched out to form an opening in part of the pad bed layer 5. Subsequently, a laminated metal wiring consisting of a laminated barrier metal 25 having a Ti/TiN structure and the Al—Si—Cu film 12 from the bottom is formed. Then, the top passivation film 13 is deposited on the resultant structure, followed by the formation of an opening in that portion of the film 13 which corresponds to the bonding pad portion 30, and then, the lead wire 14 is bonded on the bonding pad portion 30 in the assembly process. Because the pad bed layer 5b is covered with the CVD oxide film 26 having an etching rate significantly different from that of W at the time the deposit W 23 is etched back in the sixteenth embodiment, the pad bed layer 5b iis prevented from being etched. Further, as the Ti film 25 of the laminated wiring contacts the pad bed layer 5b at the bonding pad portion 30, the occurrence of film shearing can be prevented.

A twenty-first embodiment will be described referring to FIG. 38. If a CVD oxide film is used as an example of the boron-less coating film for the pad bed layer 5 in the twenty-first embodiment, the occurrence of film shearing can be avoided even with the pad bed layer 5b covered with the coating film 27 to show no exposed portion of the pad bed layer 5b at the bonding pad portion 30. The same advantage as provided in the previous embodiment can be attained also in the nineteenth embodiment.

Figure 39:
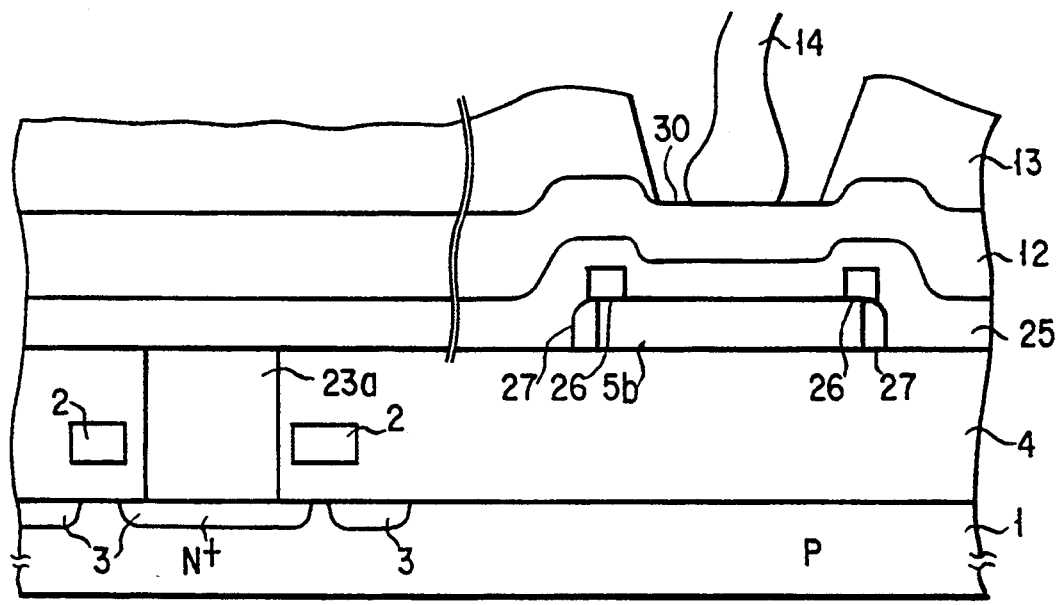
FIG. 39 is a cross section of a semiconductor IC device according to a 22nd embodiment of the invention.

A twenty-second embodiment will be described referring to FIG. 39. In the twentieth and twenty-first embodiments, when the W23 is etched back, the side of the pad bed layer 5b is exposed. When the etch-back is performed using anisotropic etching, the side of the pad bed layer 5b, even if exposed, will not be etched. If isotropic etching is used, on the other hand, the side of the pad bed layer 5b will be etched. Generally, as the design rules for the bonding pad region are not so strict, no problems will often arise if the working conversion error is considered previously, though it is better to oxide the exposed side portion of the pad bed layer 5b by an oxidizing process before depositing W. After the oxidization, the semiconductor device according to this embodiment is fabricated in the same manner as the twentieth embodiment (step-by-step cross-sectional views corresponding to those of the twenty-first embodiment are not given).

In the tenth to twenty-second embodiments, a coating film of a material selected from various kinds of materials is formed on the pad bed layer. One purpose of providing such a coating film is to prevent the contact plug material from sticking on the already-formed pad bed layer in forming the contact plug to be buried in the contact hole, thereby requiring work in removing the contact plug material therefrom. Those embodiments are therefore applied to the type where the contact plug and pad bed layer are formed in separate steps. This coating film also serves to enhance the adhesive strength of the pad bed layer. In this respect, those embodiments are applicable regardless of whether the contact plug and pad bed layer are formed in separate steps or in the same step. The pad bed serves to inhibit the reaction between the wiring and the underlying insulating film containing boron. The bonding strength between the insulating film and pad bed may be low depending on the materials for those elements. Since Cu, Al and the like have a poor bonding property, there may be a bottleneck in the case of forming the contact plug and pad bed layer in the same step to reduce the number of required steps as in the first and second embodiments. The coating film ensures the bonding strength and significantly increases the adhesion of the pad bed layer. A CVD oxide film (SiO$_2$) film is suitable as the material for this coating film. Another suitable film is a silicon oxide film (LPD oxide film) that is formed by a thermal oxide film or the reaction of extracting hydrofluoric acid from a silicon oxide supersaturated solution. If this coating film is used for a Cu pad bed, Cu which is a promising low-resistant material can be used as the contact material, allowing the application of Cu as one of the future wiring materials. In addition, the coating film can be adapted for a pure single crystal Al or W.

Figure 40:
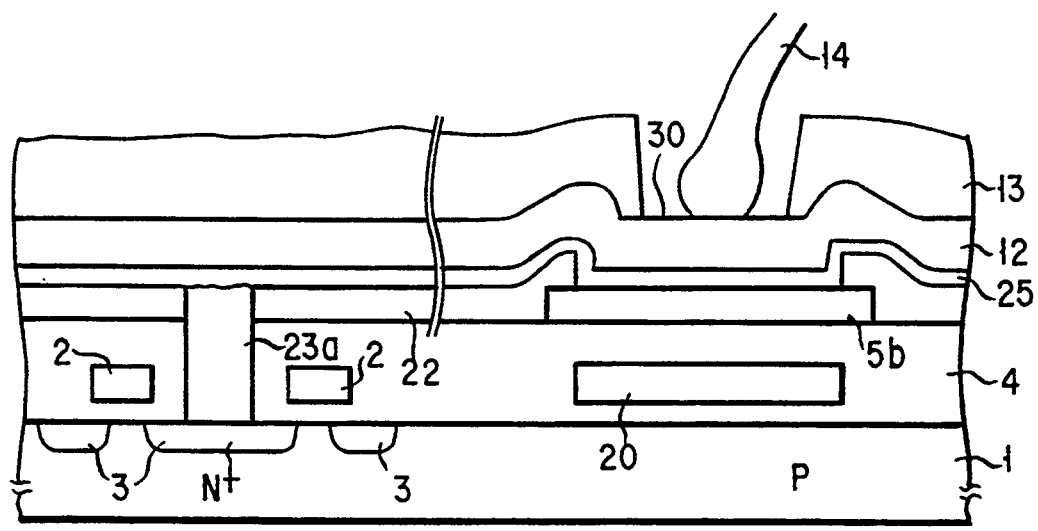
FIG. 40 is a cross section of a semiconductor IC device according to a 23th embodiment of the invention.

A buffer layer of polysilicon or the like is formed in the sixth to ninth embodiments. This buffer layer serves to relax the stress, which is applied to the bonding pad portion 30 at the time the lead wire is bonded thereto and thus may cause cracking. The buffer layer is formed using a dummy layer in the step of forming the gate electrode in any of the embodiments. Thus, this dummy layer may be formed on the field oxide film. In any case, this buffer layer is buried in the boron-containing insulating film, and directly contacts the pad bed layer buried in the insulating film particularly in those embodiments. The pad bed layer 5 may however be formed on the BPSG insulating film 4, away from the polysilicon buffer layer 20, as in a twenty-third embodiment shown in FIG. 40. Even if no polysilicon buffer layer is shown in the diagrams of the above-described embodiments, the buffer layer may actually be present as in FIG. 40. Although the foregoing description has been given of the case where the buffer layer is formed at the same time the gate electrode is formed, the buffer layer may of course be formed at the same time the other portion on the semiconductor substrate is formed. While the semiconductor IC device embodying the present invention is suitable for non-volatile devices, such as a logic and memory, it is not restricted to this particular type.

According to the present invention, the contact plug in the contact hole of a semiconductor IC device is also used as the pad bed layer at the bonding pad portion, eliminating the need for an additional step of depositing the pad bed layer and thus preventing conventional bonding shearing at the bonding pad portion. Further, the formation of the coating film on the pad bed layer can enhance the adhesion between the BPSG insulating film and the overlying pad bed layer. Furthermore, at the time the contact plug is fitted in the contact hole of the BPSG film, the contact of the contact plug to the pad bed layer can be prevented, thus facilitating the fabrication of the device.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor integrated circuit device comprising:
    a semiconductor substrate;
    an insulating film formed on said semiconductor substrate;
    a pad bed layer formed on a first portion of said insulating film;
    a contact hole formed in a second portion of said insulating film, said second portion of said insulating film being separated from said first portion of said insulating film;
    a contact plug buried in said contact hole, at least a portion of said contact plug being made of the same material as said pad bed layer;
    a wiring formed on said insulating film and contacting said contact plug; and
    a bonding pad portion arranged on a portion of a surface of said wiring over said pad bed layer.

2. The semiconductor integrated circuit device according to claim 1, wherein said insulating film contains boron, and said wiring is formed of a material which reacts with boron to yield a stable product.

3. The semiconductor integrated circuit device according to claim 1, wherein said pad bed layer is formed of a material having adhesive force to said insulating film.

4. The semiconductor integrated circuit device according to claim 1, wherein said insulating film contains boron and said wiring has a laminated structure consisting of two or more layers, the lowermost layer of said wiring being formed of a material which reacts with boron to yield a stable product.

5. The semiconductor integrated circuit device according to claim 1, wherein said pad bed layer and said contact plug have laminated structures of the same materials, and a conductivity type of the outermost layer of said contact plug is determined in accordance with a conductivity type of a diffusion layer in said semiconductor substrate which said contact plug contacts, in such a way that said outermost layer of said contact plug serves as a buffer member.

6. The semiconductor integrated circuit device according to claim 1, further comprising a side wall consisting of a thermal oxide film formed on a side of said pad bed layer.

7. The semiconductor integrated circuit device of claim 1 wherein said pad bed layer is formed in a groove formed in said insulating film.

8. The semiconductor integrated circuit device according to claim 1, wherein said pad bed layer is formed of a material selected from the group consisting of polysilicon, high melting-point metals, silicides and nitrides of said high melting-point metals, copper and aluminum.

9. The semiconductor integrated circuit device according to claim 8, wherein said high melting point metals includes tungsten and molybdenum.

10. A semiconductor integrated circuit device comprising:
a semiconductor substrate;
an insulating film formed on said semiconductor substrate;
a pad bed layer formed on a first portion of said insulating film;
a coating film for covering said pad bed layer;
a contact hole formed in a second portion of said insulating film, said second portion of said insulating film being separated from said first portion of said insulating film;
a contact plug buried in said contact hole, at least a portion of said contact plug being made of the same material as said pad bed layer; and
a wiring formed on said insulating film and contacting said contact plug; and
a bonding pad portion arranged on a portion of a surface of said wiring over said pad bed layer.

11. The semiconductor integrated circuit device according to claim 10, wherein said insulating film contains boron, and said wiring is formed of a material which reacts with boron to yield a stable product.

12. The semiconductor integrated circuit device according to claim 10, wherein said pad bed layer is formed of a material selected from the group consisting of polysilicon, high melting-point metals, silicides and nitrides of said high melting-point metals, copper and aluminum.

13. The semiconductor integrated circuit device according to claim 10, wherein said pad bed layer is formed of a material having adhesive force to said insulating film.

14. The semiconductor integrated circuit device according to claim 10, wherein said insulating film contains boron and said wiring has a laminated structure consisting of two or more layers, the lowermost layer of said wiring being formed of a material which reacts with boron to yield a stable product.

15. The semiconductor integrated circuit device according to claim 10, wherein said coating film is made of a material having a lower etching rate than said contact plug.

16. The semiconductor integrated circuit device according to claim 10, wherein said pad bed layer and said contact plug have laminated structures of the same materials, and a conductivity type of the outermost layer of said contact plug is determined in accordance with a conductivity type of a diffusion layer in said semiconductor substrate which said contact plug contacts, in such a way that said outermost layer of said contact plug serves as a buffer member.

17. The semiconductor integrated circuit device according to claim 10, further comprising a side wall consisting of a thermal oxide film formed on a side of said pad bed layer.

18. The semiconductor integrated circuit device of claim 10 wherein said pad bed layer is formed in a groove formed in said insulating film.

19. The semiconductor integrated circuit device according to claim 12, wherein said high melting point metals include tungsten and molybdenum.

20. A semiconductor integrated circuit device comprising:
a semiconductor substrate;
an insulating film formed on said semiconductor substrate;
a buffer layer buried in a first portion of said insulating film;
a pad bed layer deposited on said buffer layer, said pad bed layer being formed of a material having adhesive force to said buffer layer;
a contact hole formed in a second portion of said insulating film, said second portion of said insulating film being separated from said first portion of said insulating film;
a contact plug buried in said contact hole, at least a portion of said contact plug being made of the same material as said pad bed layer;
a wiring formed on said insulating film and contacting said contact plug; and
a bonding pad portion arranged on a portion of a surface of said wiring over said pad bed layer.

21. The semiconductor integrated circuit device according to claim 20, wherein a plurality of pad bed layers of a predetermined shape are formed on said buffer layer.

22. A semiconductor integrated circuit device comprising:
a semiconductor substrate;
an insulating film formed on said semiconductor substrate;
a buffer layer buried in a first portion of said insulating film;
a pad bed layer deposited on said buffer layer, said pad bed layer being formed of a material having adhesive force to said buffer layer;
a coating film for covering said pad bed layer;
a contact hole formed in a second portion of said insulating film, said second portion of said insulating film being separated from said first portion of said insulating film;
a contact plug buried in said contact hole, at least a portion of said contact plug being made of the same material as said pad bed layer;
a wiring formed on said insulating film and contacting said contact plug; and
a bonding pad portion arranged on a portion of a surface of said wiring over said pad bed layer.

23. The semiconductor integrated circuit device according to claim 22, wherein a plurality of pad bed layers of a predetermined shape are formed on said buffer layer.

* * * * *